United States Patent
Tsukamoto et al.

(10) Patent No.: US 8,487,345 B2
(45) Date of Patent: Jul. 16, 2013

(54) INFORMATION RECORDING AND REPRODUCING DEVICE

(75) Inventors: Takayuki Tsukamoto, Kanagawa-ken (JP); Tsukasa Nakai, Tokyo (JP); Akira Kikitsu, Kanagawa-ken (JP); Takeshi Yamaguchi, Kanagawa-ken (JP); Sumio Ashida, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 101 days.

(21) Appl. No.: 12/885,952

(22) Filed: Sep. 20, 2010

(65) Prior Publication Data

US 2011/0068319 A1    Mar. 24, 2011

Related U.S. Application Data

(63) Continuation of application No. PCT/JP2008/056495, filed on Apr. 1, 2008.

(51) Int. Cl.
*H01L 21/02* (2006.01)

(52) U.S. Cl.
USPC ............ 257/190; 257/5; 257/295; 257/12; 257/290; 257/369; 438/166; 438/48; 438/59; 438/492

(58) Field of Classification Search
USPC  257/190, 295, 12, 290, 369, 77, 90; 438/166, 438/48, 59, 482, 238
See application file for complete search history.

(56) References Cited

U.S. PATENT DOCUMENTS

| | | | | |
|---|---|---|---|---|
| 4,757,492 A | * | 7/1988 | Fukushima et al. | 369/100 |
| 4,969,141 A | * | 11/1990 | Takaoka et al. | 369/100 |
| 5,420,845 A | * | 5/1995 | Maeda et al. | 369/100 |
| 5,889,756 A | * | 3/1999 | Ichihara et al. | 369/275.2 |
| 2004/0130998 A1 | * | 7/2004 | Iwasa et al. | 369/94 |
| 2006/0203542 A1 | | 9/2006 | Kurotsuchi et al. | |
| 2006/0228531 A1 | * | 10/2006 | Iwasa et al. | 428/195.1 |
| 2007/0029606 A1 | | 2/2007 | Noh et al. | |
| 2011/0024713 A1 | * | 2/2011 | Kamata et al. | 257/2 |

FOREIGN PATENT DOCUMENTS

| | | |
|---|---|---|
| JP | 5-62249 | 3/1993 |
| JP | 2002-203392 | 7/2002 |
| JP | 2002-279690 | 9/2002 |
| JP | 2005-317812 | 11/2005 |
| JP | 2006-165553 | 6/2006 |
| JP | 2006-221737 | 8/2006 |
| JP | 2007-43176 | 2/2007 |
| JP | 2007-194586 | 8/2007 |
| JP | 2007-273618 | 10/2007 |

\* cited by examiner

*Primary Examiner* — Telly Green

(74) *Attorney, Agent, or Firm* — Oblon, Spivak, McClelland, Maier & Neustadt, L.L.P.

(57) ABSTRACT

According to one embodiment, an information recording and reproducing device includes a stacked body. The stacked body includes a first layer, a second layer and a recording layer provided between the first layer and the second layer. The recording layer includes a phase-change material and a crystal nucleus. The phase-change material is capable of reversely changing between a crystal state and an amorphous state by a current supplied via the first layer and the second layer. The crystal nucleus is provided in contact with the phase-change material and includes a crystal nucleus material having a crystal structure identical to a crystal structure of the crystal state of the phase-change material, and a crystal nucleus coating provided on a surface of the crystal nucleus material and having a composition different from a composition of the crystal nucleus material.

19 Claims, 22 Drawing Sheets

FIG. 5C CRYSTAL STATE (STORAGE STATE)

FIG. 5B AMORPHOUS STATE (INITIAL STATE)

SET (WRITE) OPERATION
LARGE RESISTANCE→SMALL RESISTANCE

RESET (ERASE) OPERATION
SMALL RESISTANCE→LARGE RESISTANCE

·····▶ MOVEMENT OF ELECTRON
——▶ MOVEMENT OF ION

INFORMATION RECORDING AND REPRODUCING DEVICE

CROSS-REFERENCE TO RELATED APPLICATIONS

This is a conceptual application of International Application PCT/JP2008/056495, filed on Apr. 1, 2008; the entire contents of which are incorporated herein by reference.

FIELD

Embodiments described herein relate generally to an information recording and reproducing device.

BACKGROUND

Small-sized portable devices are widespread worldwide these days, and at the same time demand for small-sized and large-capacity nonvolatile memory is rapidly expanding with significant progress in high-speed information transmission network. In particular, NAND flash memory and small-sized HDD (hard disk drive) have made rapid progress in recording density and form a big market.

Under such a situation, some ideas of new memory that aim to greatly exceed the limit of recording density are proposed. As one of them, a phase-change nonvolatile memory device (phase-change memory) (PCRAM: phase-change random access memory) is investigated. The phase-change nonvolatile memory device is a nonvolatile memory device utilizing the property that a phase-change film changes between a crystal state and an amorphous state by applying an electric field pulse to the phase-change film. By reversibly changing the phase-change film between a high resistance state (amorphous state, OFF) and a low resistance state (crystal state, ON), information is stored so that the information can be rewritten and may not be erased even if the power supply is cut. Nonvolatile properties are achieved because both the high resistance state and the low resistance state of the phase-change film are stable. The readout is performed by passing a readout current that is small enough not to cause the writing/erasing through the recording material and measuring the electric resistance of the recording material.

In regard to the phase-change nonvolatile memory device, it is desirable to further increase the operating speed of the writing and the like. As to this, a nonvolatile memory device is reported that includes: a lower electrode; an upper electrode; a recording layer provided between the lower electrode and the upper electrode and containing a phase-change material; and a block layer capable of blocking the phase change of the recording layer (JP-A 2007-194586 (Kokai)). The following is described in this document: since the device includes the block layer capable of blocking the phase change of the recording layer, the heat release toward the upper electrode is suppressed, and the phase change region at the time when a writing current is applied is significantly limited; and this enables to provide high heat generation efficiency, which can achieve not only less writing current but also higher writing speed than in the past.

BRIEF DESCRIPTION OF THE DRAWINGS

FIG. 5A to FIG. 5C are conceptual views for describing the operation of recording/reading information in an example of the information recording and reproducing device according to the embodiment;

FIG. 28 is a schematic view illustrating a specific example including a normal MIS transistor.

DETAILED DESCRIPTION

Figure 1A:
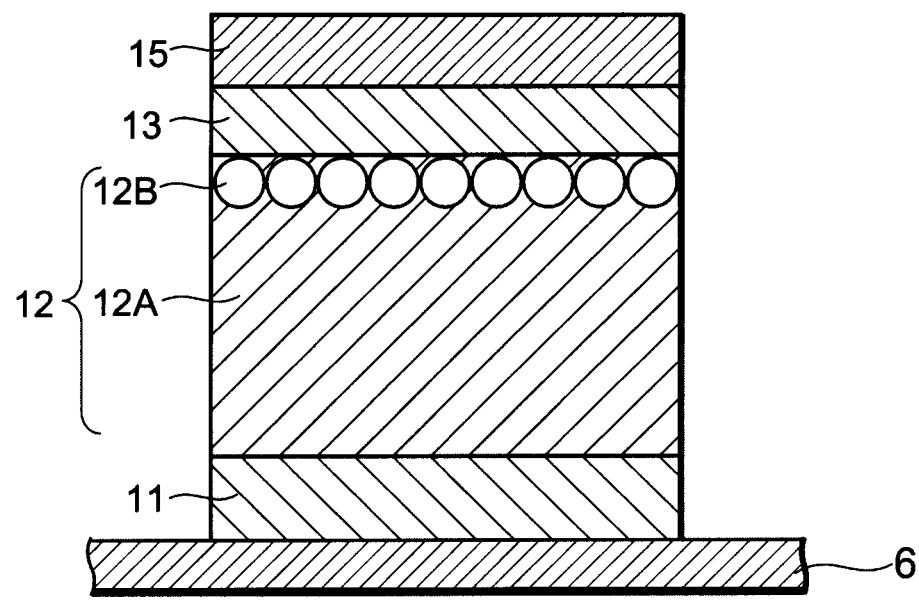
FIGS. 1A and 1B are schematic cross-sectional views illustrating an example (first specific example) of an information recording and reproducing device according to an embodiment.

In general, according to one embodiment, an information recording and reproducing device includes a stacked body. The stacked body includes a first layer, a second layer and a recording layer provided between the first layer and the second layer. The recording layer includes a phase-change material and a crystal nucleus. The phase-change material is capable of reversely changing between a crystal state and an amorphous state by a current supplied via the first layer and the second layer. The crystal nucleus is provided in contact with the phase-change material and includes a crystal nucleus material having a crystal structure identical to the crystal state of a crystal structure of the phase-change material, and a crystal nucleus coating provided on a surface of the crystal nucleus material and having a composition different from a composition of the crystal nucleus material.

Embodiments of the invention will now be described with reference to the drawings. In the drawings, like components are marked with the same reference numerals and a detailed description is omitted as appropriate.

Figure 1B:
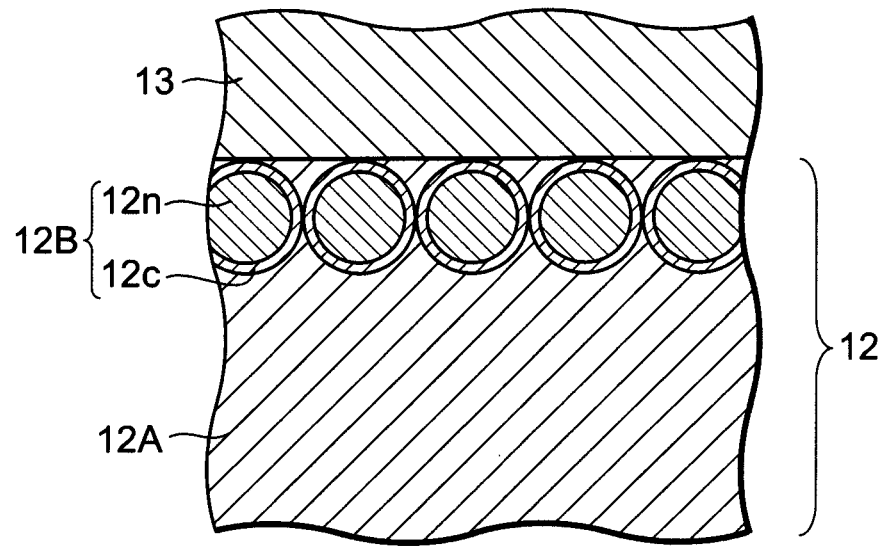

FIGS. 1A and 1B are schematic cross-sectional views illustrating an information recording and reproducing device (first specific example) according to an embodiment of the invention.

FIG. 1A is a schematic cross-sectional view illustrating the configuration of the first specific example. As illustrated in FIG. 1A, the information recording and reproducing device of this specific example includes: a first interconnection 6; an electrode layer (first layer) 11 provided on the first interconnection 6; a recording layer 12 (phase-change layer) provided on the major surface of the electrode layer 11; an electrode layer (second layer) 13 provided on the major surface of the recording layer 12; and a second interconnection 15 provided on the electrode layer 13. Here, the "major surface" is a surface perpendicular to the stacking direction (the vertical direction in FIGS. 1A and 1B) of the electrode layer 11, the recording layer 12, the electrode layer 13 and the like. The electrode layers 11 and 13 are provided in order to obtain an electrical connection to the recording layer 12. The electrode layers 11 and 13 may also function as, for example, a barrier layer that suppresses the diffusion of elements between the recording layer 12 and the components thereabove and therebelow, and the like.

The recording layer 12 is a layer for performing the recording of information, and is a layer capable of reversibly changing between a first state of low resistance and a second state of high resistance by a current supplied via the electrode layer 11 and the electrode layer 13.

In this specific example, the recording layer 12 includes: a phase-change material 12A capable of reversibly changing between a crystal state and an amorphous state; and a crystal nucleus 12B for changing the phase-change material 12A from the amorphous state to the crystal state. The crystal nucleus 12B has a particle form, for example (hereinbelow, the crystal nucleus 12B having a particle form may be referred to as a "crystal nucleus particle 12B"). A layer containing the crystal nucleus particles 12B is formed in a portion of the recording layer 12 near the interface with the electrode layer 13. Although the crystal nucleus particles 12B are disposed on the electrode layer 13 side in FIGS. 1A and 1B, they may be disposed on the electrode layer 11 side.

The crystal nucleus particle 12B is a particle functioning as a crystal nucleus at the time of the crystallization of the phase-change material 12A, and includes a crystal particle with a size of nanometer order (what is called a nanocrystal particle). The crystal nucleus particle 12B has a relatively high melting point, and is always kept in the crystal state irrespective of the state (the crystal state or the amorphous state) of the phase-change material 12A.

In the specification of the application, "crystal" refers to not only a complete crystal but also single crystals having a defect and polycrystalline states. On the other hand, "amorphous" refers to not only materials having a completely disordered atomic arrangement but also, for example, those having a short range periodic structure and those containing fine crystal particles in a disordered matrix.

FIG. 1B is a schematic cross-sectional view illustrating the enlarged portion of the crystal nucleus particles 12B and therearound. As illustrated in FIG. 1B, the crystal nucleus particle 12B includes: a crystal nucleus material 12n formed of a nanocrystal particle; and a crystal nucleus coating 12c provided on the surface of the crystal nucleus material 12n. As described later, the crystal nucleus coating 12c is provided in order to suppress the mutual melting of the crystal nucleus material 12n and the phase-change material 12A to maintain the crystal state of the crystal nucleus material 12n.

However, the crystal nucleus particle 12B that does not include the crystal nucleus coating 12c and includes the crystal nucleus material 12n also is included within the scope of the embodiment. As described later in detail, in the case where a material having a higher melting point than the phase-change material 12A is used as the material of the crystal nucleus material 12n, the crystal nucleus material 12n can be maintained in the crystal state without being melted even if the phase-change material 12A is melted into the amorphous state.

Furthermore, when the crystal nucleus material 12n has a smaller size, the melting point thereof tends to increase as compared with those in a bulk state. Therefore, even in the case where the crystal nucleus material 12n and the phase-change material 12A are made of the same material, the crystal nucleus material 12n can be maintained in the crystal state without being melted even if the phase-change material 12A is melted into the amorphous state.

Figure 2:
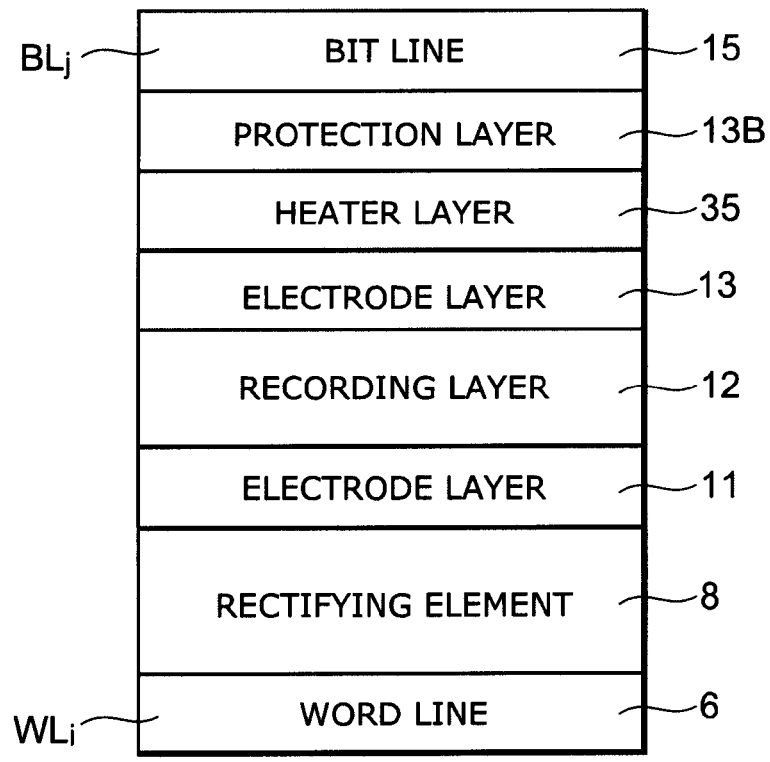
FIG. 2 is a schematic cross-sectional view illustrating another example of the stacked structure of the information recording and reproducing device according to the embodiment.

FIG. 2 is a schematic cross-sectional view illustrating another example of the stacked structure.

As illustrated in FIG. 2, a rectifying element 8 may be provided between the first interconnection 6 and the electrode layer 11. Any diode selected from a Zener diode, a p-n junction diode, and a Schottky diode, for example, may be used for the rectifying element 8. Alternatively, a non-ohmic element such as a MIM (metal-insulator-metal) element may be used. A barrier layer may be provided also between the first interconnection 6 and the rectifying element 8.

Furthermore, a heater layer 35 made of a material with a resistivity of, for example, about $10^{-5}$ Ωcm or more may be provided on the electrode layer 11 side or the electrode layer 13 side in order to efficiently perform the heating of the recording layer 12 during the erase operation.

In the case where this information recording and reproducing device has the configuration of a cross-point cell array described later, the first interconnection 6 and the second interconnection 15 may be taken as a "word line" and a "bit line," respectively, or vice versa.

The electrode layers 11 and 13 may also function as a barrier layer that suppresses the diffusion of the material of the recording layer 12. To this end, materials expressed by "MN", for example, are used. "M" is at least one element selected from a group consisting of Ti, Zr, Hf, V, Nb, and Ta. "N" is nitrogen.

The recording layer 12 may have a film thickness of 10 nm to 20 nm, for example. The cell width (width along the major surface) may be selected freely, for example, 40 nm or less.

Next, the operating state of the recording layer 12 according to this specific example will now be described.

Phase changes occur in the recording layer 12 during operation such as the writing and erasing. Out of these phase changes, the change from the amorphous state to the crystal state is produced by the generation of a crystal nucleus in the first place and subsequent crystal growth starting from the crystal nucleus. Here, there are a material (crystal nucleus formation rate-controlling material) in which the crystal nucleus formation is slow and the crystal growth is rapid, and a material (crystal growth rate-controlling material) in which the former (crystal nucleus formation) is rapid and the latter (crystal growth) is slow. GeSbTe materials typified by $Ge_2Sb_2Te_5$ and the like are given as the crystal nucleus formation rate-controlling material, and AgInSbTe, GeSb, SbTe, and the like are given as the crystal growth rate-controlling material.

Figure 3:
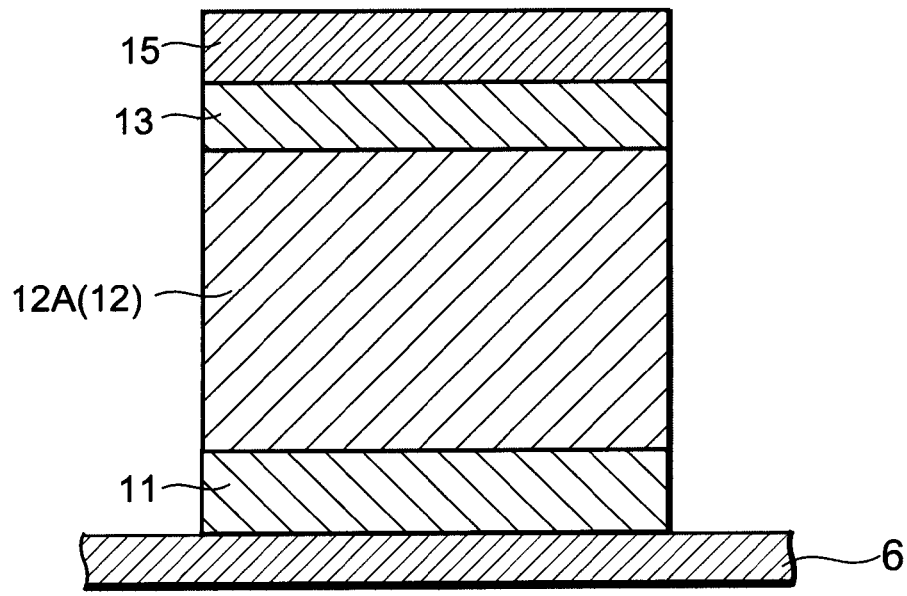
FIG. 3 is a schematic cross-sectional view illustrating an information recording and reproducing device according to a comparative example that is compared with the first specific example.

FIG. 3 is a schematic cross-sectional view illustrating an information recording and reproducing device according to a comparative example that is compared with this specific example. As illustrated in FIG. 3, in the information recording and reproducing device according to the comparative example, the crystal nucleus particle 12B does not exist in the recording layer 12 (phase-change layer). Therefore, the rate of crystallization is controlled by either crystal nucleus formation or crystal growth. That is, the time required for the phase change from the amorphous state to the crystal state is relatively long.

In contrast, in the information recording and reproducing device according to this specific example, the crystal nucleus particle 12B functioning as a crystal nucleus for crystallizing the phase-change material 12A is provided in the recording layer 12 (phase-change layer). Therefore, if a material having a rapid crystal growth rate is used as the recording layer 12, the step of crystal nucleus generation, which is necessary in the comparative example, is not necessary and the crystal growth rapidly progresses from the crystal nucleus particle 12B when the recording layer 12 changes from the amorphous state to the crystal state.

Thereby, in the information recording and reproducing device according to this specific example, the time required for the phase change from the amorphous state to the crystal state is relatively short. That is, the speed of the write or erase operation increases. Furthermore, since the crystallization is brought about by a small current, power consumption is reduced.

In addition, in the information recording and reproducing device according to this specific example, by the presence of the crystal nucleus particle 12B, (1) the cross section of the current pathway is reduced and this reduces power consumption. Furthermore, in the information recording and reproducing device according to this specific example, (2) the phase-change material 12A is crystallized surely and this ensures stability in operation.

Figure 4:
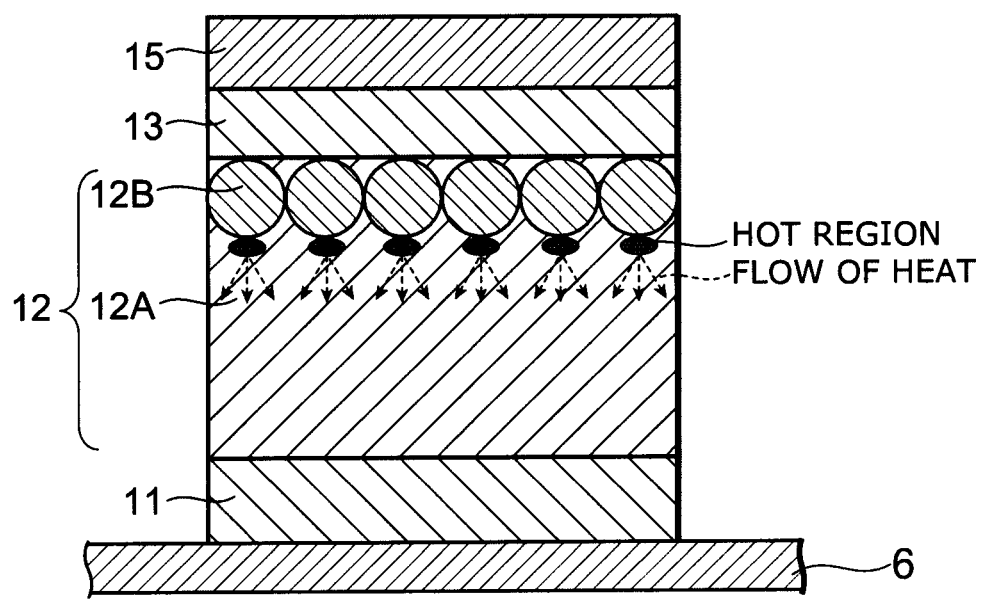
FIG. 4 is a schematic cross-sectional view illustrating the mechanism of the heating of the recording layer according to the embodiment.

First, the point of (1) reducing the cross section of the current pathway to reduce power consumption will now be described with reference to FIG. 4. FIG. 4 is a schematic cross-sectional view illustrating the mechanism of the heating of the recording layer 12.

The electrical connection between the recording layer 12 and the electrode layer 13 is obtained by means of an interface at which the crystal nucleus particle 12B and the electrode layer 13 are in contact with each other. Assuming that the crystal nucleus particle 12B has a complete globular shape, the recording layer 12 and the electrode layer 13 are connected by a plurality of points (contacts between the globular crystal nucleus particles 12B and the electrode layer 13). Therefore, the cross section of the current pathway between the electrode layer 13 and the recording layer 12 is small at the interface as compared with the information recording and reproducing device of the comparative example in which the recording layer 12 has a uniform interface.

Furthermore, as described later, an optional material may be disposed in the vacant spaces existing between the plurality of crystal nucleus particles 12B. In the case where a material having a lower electric conductivity than the crystal nucleus particle 12B is disposed in the vacant spaces, the current between the electrode layer 13 and the phase-change material 12A mainly flows via the contacts between the crystal nucleus particles 12B and the phase-change material 12A.

Thereby, the information recording and reproducing device of this specific example enables to reduce the current in the recording layer 12 during operation, standby (non-operation) and the like.

As illustrated in FIG. 4, also the heating is locally performed via the contacts between the crystal nucleus particles 12B and the phase-change material 12A in accordance with the current pathways described above. Therefore, the crystallization due to heating progresses from the contacts between the crystal nucleus particles 12B and the phase-change material 12A, and the entire phase-change material 12A can be crystallized smoothly and rapidly. Next, the point that (2) the phase-change material 12A is crystallized surely to ensure stability in operation will now be described.

By providing the crystal nucleus particle 12B, the phase-change material 12A is crystallized surely and rapidly when an operating voltage is applied. Therefore, the possibility that the writing and the like are incompletely performed can be reduced as compared with the information recording and reproducing device of the comparative example which includes no crystal nucleus. Furthermore, by appropriately selecting the sizes of the individual crystal nucleus particles 12B and providing them in a prescribed disposition, the entire phase-change material 12A can be crystallized more surely and rapidly. Thus, the information recording and reproducing device according to this specific example ensures stability in operation.

Next, the structure and material of the crystal nucleus particle 12B and a method for manufacturing the same will now be described.

The crystal nucleus particle 12B is formed of the crystal nucleus material 12n formed of a nanocrystal particle. Alternatively, the crystal nucleus coating 12c may be provided on the surface of the crystal nucleus material 12n. The crystal nucleus may be preferably formed to be uniform. The individual crystal nucleus particles 12B may have almost equal sizes and may exist at regular intervals in view of easily crystallizing the phase-change material 12A. The particle size of the crystal nucleus particle 12B may be preferably smaller in view of increasing the crystallization temperature and melting point. Specifically, it is preferably about 20 nm or less, more preferably about 10 nm or less, and further preferably 5 nm or less. On the other hand, if the crystal nucleus particle 12B has an excessively small size, it is difficult to obtain uniform size distribution. Therefore, the crystal nucleus particle 12B is preferably larger than 2 nm. Furthermore, to ensure a good thermal conductivity, the crystal nucleus particle 12B preferably has a size not more than about ⅓ the size of the memory cell. For example, in the case where the memory cell has a size of about 30 nm, the crystal nucleus particle 12B preferably has a size of about 10 nm or less.

An optional material may be disposed in the vacant spaces existing between the plurality of crystal nucleus particles 12B. For example, a material of the same composition as the phase-change material 12A, a material of the same composition as the crystal nucleus material 12n, a phase-change material of a different composition from them, any oxide material, nitride material, or the like is given.

Next, the crystal nucleus material 12n will now be described.

The crystal nucleus material 12n is formed of a nanocrystal particle. The material thereof may be the same as the phase-change material 12A or a different material therefrom. Specifically, a semiconductor such as germanium, for example, is given. In regard to the crystal structure, the crystal nucleus material 12n and the phase-change material 12A preferably have an identical or similar crystal structure on the basis of the requirement that the crystal nucleus particle 12B be functional as a crystal nucleus at the time of the crystallization of the phase-change material 12A. Furthermore, also in regard to the lattice constant, the material of the crystal nucleus material 12n preferably has an equal or similar lattice constant to the material of the phase-change material 12A.

On the other hand, when the crystal nucleus material 12n is formed of a material having a higher melting point than the phase-change material 12A, the crystal state of the crystal nucleus material 12n is maintained more surely even in a state in which the phase-change material 12A is melted.

The crystal nucleus material 12n formed of a nanocrystal particle may be manufactured by the following method, for example. When the recording layer 12 is formed on an under layer, the material of the crystal nucleus material 12n is supplied onto the surface of the under layer to produce a nucleus in an island shape, and in this state the deposition is once stopped. Then, processing such as anneal may be performed. In this way, the crystal nucleus material 12n formed of a nanocrystal particle can be formed on the surface of the under layer. Furthermore, after that, the workpiece may be exposed to, for example, nitrogen or oxygen atmosphere, or the like to form the crystal nucleus coating 12c on the surface of the crystal nucleus material 12n.

Furthermore, also a method using a SAM (self-assembled monolayer) is given as a method for manufacturing the crystal nucleus material 12n formed of a nanocrystal particle (Yoshitake Masuda, The bulletin of the nano science and technology, Vol. 5, No. 2, http://staff.aist.go.jp/masuda-y/link/review_nano_2006.pdf). A SAM with its surface substituted with a functional group having a desired structure is used as a template, a source solution is dropped onto the SAM surface, and required processing is performed. Thereby, the crystal nucleus material 12n formed of a minute nanocrystal particle can be formed on the SAM surface.

Alternatively, the crystal nucleus material 12n formed of a nanocrystal particle can be obtained also by the next method. First, nitrogen is added to a desired position (a position where the crystal nucleus material 12n is formed) in the phase-change material 12A, and the recording layer 12 is film-formed. Then, anneal processing is performed. In a region of much nitrogen, crystal growth is inhibited due to the presence of the nitrogen, which forms the crystal nucleus material 12n formed of a nanocrystal particle with a small particle size. Furthermore, by the presence of the nitrogen, the surface of the crystal nucleus material 12n is nitrided to form also the crystal nucleus coating 12c at the same time.

Alternatively, the method described later in regard to FIG. 9A to FIG. 11C may be used.

Next, the crystal nucleus coating 12c will now be described. The crystal nucleus coating 12c is provided in order to maintain the crystal state of the crystal nucleus material 12n.

In general, the melting point of a crystal particle tends to increase as the size thereof decreases. In this specific example, the crystal nucleus particle 12B has a minute size of, for example, about 10 nm to 20 nm. Therefore, the crystal nucleus particle 12B has a higher melting point than those in a bulk state. Thereby, by appropriately selecting the size of the phase-change material 12A, the crystal nucleus particle 12B is allowed to have a higher melting point than the phase-change material 12A. Consequently, those configurations can be obtained in which only the phase-change material 12A phase-changes and the crystal nucleus particle 12B does not phase-change (keeps the crystal state).

However, if the phase-change material 12A once becomes in the crystal state, the phase-change material 12A and the crystal nucleus particle 12B are joined continuously. Accordingly, when Joule heat is then applied in order to turn the crystal state into the amorphous state, this heat may cause the phase-change material 12A and the crystal nucleus particle 12B to melt together. That is, not only the phase-change material 12A but also the crystal nucleus particle 12B may phase-change (become in the amorphous state) to result in preventing the crystal nucleus particle 12B from keeping the crystal state.

As illustrated in FIG. 1B, the crystal state of the crystal nucleus particle 12B can be maintained by providing the crystal nucleus coating 12c on the surface of the crystal nucleus material 12n. The crystal nucleus coating 12c protects the interior (the crystal nucleus material 12n) of the crystal nucleus particle 12B and suppresses the mutual melting of the phase-change material 12A and the crystal nucleus particle 12B. Thereby, combined with the difference in melting point between the phase-change material 12A and the crystal nucleus particle 12B described above, the crystal state of the crystal nucleus particle 12B is maintained.

The crystal nucleus coating 12c may be obtained by, for example, nitriding the surface of the crystal nucleus material 12n. For example, in the case where the crystal nucleus material 12n is germanium, the crystal nucleus coating 12c may be germanium nitride (GeN).

Furthermore, a region in which much nitrogen is contained may be provided at the interface between a layer including the crystal nucleus particle 12B and the phase-change material 12A. In this nitrogen-containing region, germanium in the phase-change material 12A and germanium in the crystal nucleus particle 12B react preferentially with nitrogen. Consequently, a nitrogen-germanium (GeN) bond is formed and other bonds occur less easily. Therefore, even in the case where the phase change of the phase-change material 12A is repeated, the phase-change material 12A and the crystal nucleus particle 12B hardly melt together.

On the other hand, the crystal nucleus coating 12c need not necessarily be a substance such as nitride but may be something like a denatured layer or a transformed layer formed on the surface of the crystal nucleus material 12n. For example, the surface of the crystal nucleus material 12n may be exposed to a minute amount of oxygen, another atmosphere or plasma; thereby, the surface of the crystal nucleus material 12n does not become a clean surface, but a surface with a different kind of element attached thereon is formed. Such a surface suppresses the melting of the crystal nucleus material 12n with the phase-change material 12A into a single body when the phase-change material 12A melts. Furthermore, such a surface delimits the crystal nucleus material 12n, and thereby suppresses the joining of the crystal nucleus material 12n and the phase-change material 12A into a single body even when the phase-change material 12A is crystallized. In other words, in the case where the surface of the crystal nucleus material 12n is not a clean surface, such a surface functions as the crystal nucleus coating 12c.

As described later, if oxide of Hf, Ta, Cr, or the like is used as the crystal nucleus coating 12c intentionally, the melting of the crystal nucleus material 12n can be suppressed more.

Next, the structure of the recording unit usable for this embodiment will now be described with reference to FIGS. 5A to 5C.

Figure 5A:
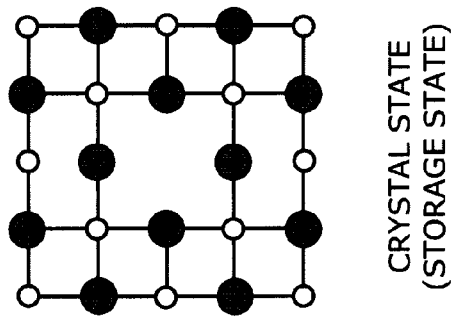
Figure 5A:
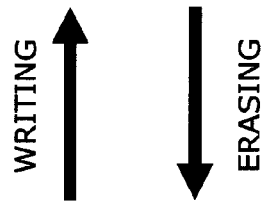
Figure 5A:
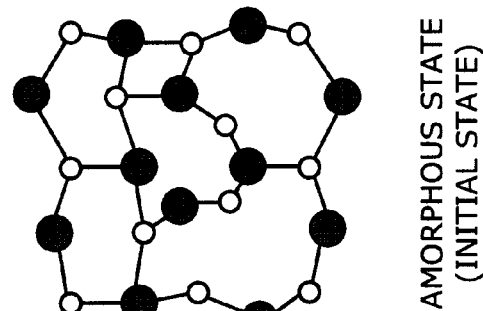
Figure 5A:
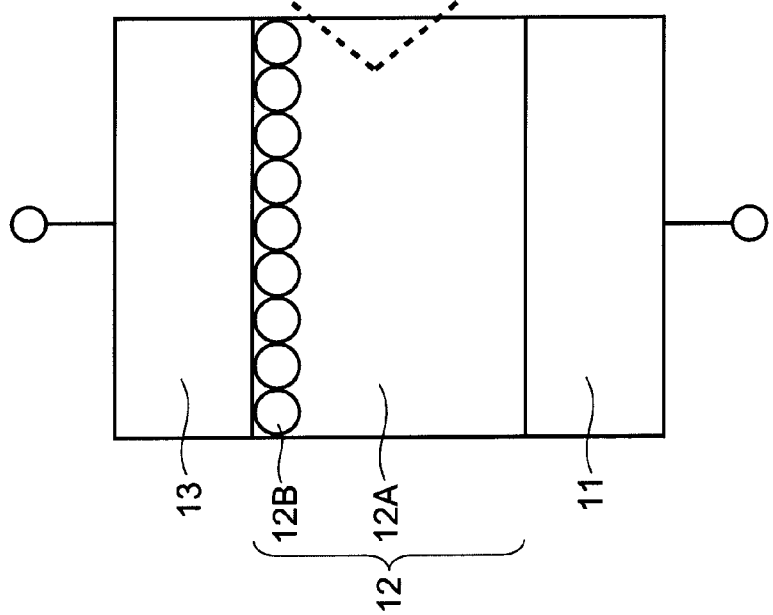

FIG. 5A to FIG. 5C are conceptual views for describing the operation of recording/reading information in an example of the information recording and reproducing device of this embodiment.

As illustrated in FIG. 5A, the recording unit of this specific example has a structure in which the electrode layers 11 and 13 are placed on both sides of the recording layer 12. The recording layer 12 is a phase-change layer containing a material that changes between the crystal state and the amorphous state by applying a voltage, and includes the phase-change material 12A and the crystal nucleus particle 12B. Chalcogenide-based materials are specifically given as the material of the phase-change material 12A. "Chalcogenide" is a general term of compounds containing a group 16 element such as Se and Te, derived from a synonym of the group 16 elements, the "chalcogens." For example, a material containing Se or Te is given as a specific material. More specifically, $Ge_2Sb_2Te_5$, GeSbTe, SbTe, AsSbTe, SeSbTe, AgInSbTe, and the like are given.

Nitrogen may be introduced in the whole or a part of the material mentioned above. Introducing nitrogen increases the phase-change temperature, and this suppresses the phase change. Therefore, the crystal state or the amorphous state is stabilized. Thereby, the recorded information becomes hard to erase, and nonvolatile properties can be ensured more steadily.

Next, the mechanism of the record, erase, and read operation of the recording unit according to this specific example will now be described.

FIG. 5B is a schematic view illustrating the structure of the amorphous state of a chalcogenide, specifically $Ge_2Sb_2Te_5$, which may be used as the material of the phase-change material 12A. In this case, this compound has a structure formed of various kinds of rings such as a four-membered ring, six-membered ring, and eight-membered ring. On the other hand, FIG. 5C is a schematic view illustrating the structure of the crystal state of $Ge_2Sb_2Te_5$. In this case, this compound has a structure formed of only four-membered rings, six-membered rings, and eight-membered rings.

Chalcogenides such as $Ge_2Sb_2Te_5$ used for the phase-change material 12A experience a phase change when heat is applied, and change between the low resistive crystal state and the high resistive amorphous state. In the specific example illustrated in FIG. 5A to FIG. 5C, the amorphous state (FIG. 5B) is the initial state; and when this state phase-changes into the crystal state (FIG. 5C), the writing is performed. In contrast, when a phase change from the crystal state (FIG. 5C) to the amorphous state (FIG. 5B) occurs, the written information is erased. Also a system is possible in which the crystal state (FIG. 5C) is taken as the initial state and the writing is performed when this state phase-changes into the amorphous state (FIG. 5B).

The recording (writing) of information in the recording layer 12 is performed by applying a voltage to the recording layer 12 to pass a large current pulse. The Joule heat generated at this time heats the phase-change material 12A to the crystallization temperature or higher. This temperature is kept for a certain period of time, for example, a time shorter than one microsecond. Then, the recording layer 12 (the phase-change material 12A) is cooled slowly to be phase-changed into the crystal state. Thereby, information is written.

The erasing of information in the recording layer 12 is performed by the Joule heat generated by passing a large current pulse through the recording layer 12. This Joule heat heats the phase-change material 12A to the melting point (in the case of $Ge_2Sb_2Te_5$, the melting point is 633° C.) or higher. Then, the recording layer 12 (the phase-change material 12A) is cooled rapidly in a time shorter than, for example, 100 nanoseconds to be phase-changed into the amorphous state. Thereby, information is erased.

The reading of information in the recording layer 12 is performed by applying a voltage to the recording layer 12 to pass a current pulse and detecting the resistance value. However, the current pulse has small amplitude enough not to cause the phase change in the material of the recording layer 12.

Next, another example (second specific example) of this embodiment will now be described with reference to FIGS. 6A and 6B.

Figure 6A:
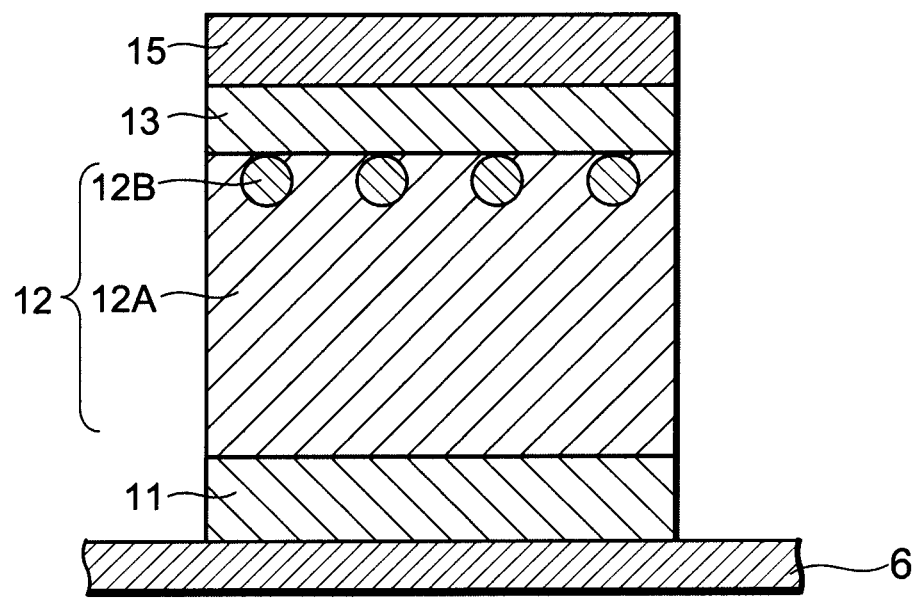
FIG. 6A and FIG. 6B are schematic cross-sectional views illustrating an information recording and reproducing device according to a second specific example.
Figure 6B:
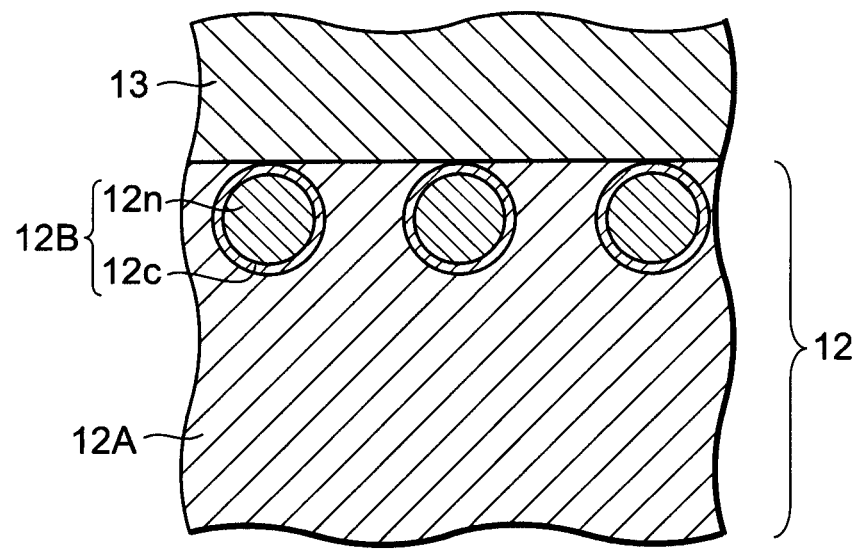

FIGS. 6A and 6B are schematic cross-sectional views illustrating an information recording and reproducing device according to the second specific example. As illustrated in FIGS. 6A and 6B, also in the second specific example, the crystal nucleus particles 12B exist near the interface with the electrode layer 13 similarly to the first specific example, but unlike the first specific example, the crystal nucleus particles 12B exist relatively sparsely. That is, the density of the crystal nucleus particle 12B is low as compared with the first specific example. Also in this case, the crystal growth of the phase-change material 12A progresses smoothly from the crystal nucleus particle 12B. Accordingly, the speed of operation such as the writing or erasing increases. Furthermore, the crystallization can be brought about by a small current. Therefore, also the information recording and reproducing device according to the second specific example enables high-speed operation and the reduction of power consumption.

Moreover, by the presence of the crystal nucleus particle 12B, the phase-change material 12A is crystallized surely when an operating voltage is applied. Therefore, the possibility that the writing or the like is incompletely performed is reduced significantly. In other words, also the information recording and reproducing device according to the second specific example ensures stability in operation.

Next, another example (third specific example) of this embodiment will now be described with reference to FIGS. 7A and 7B.

Figure 7A:
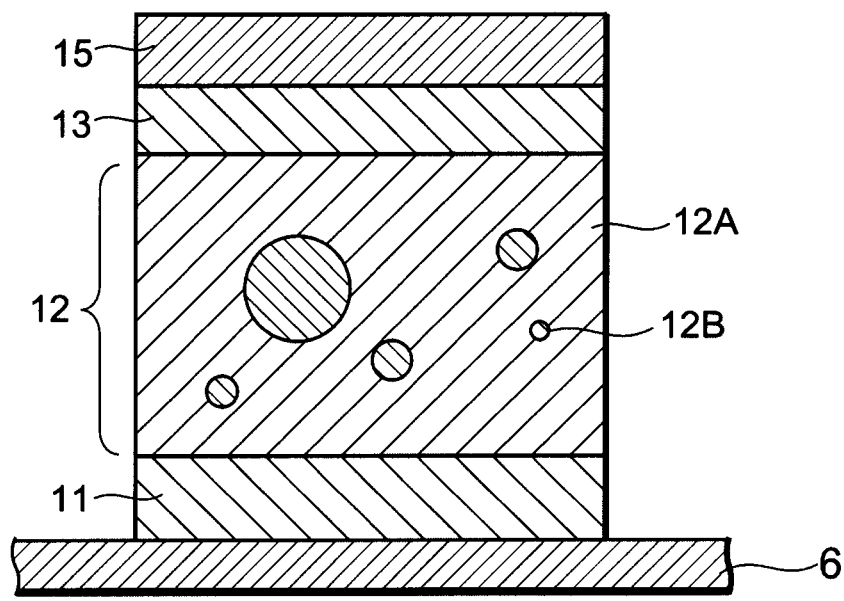
FIG. 7A and FIG. 7B are schematic cross-sectional views illustrating an information recording and reproducing device according to a third specific example.
Figure 7B:
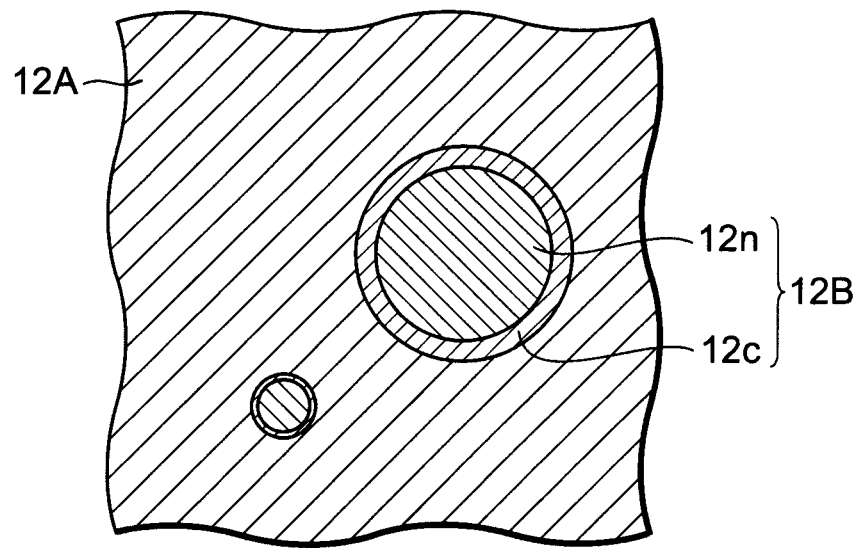

FIGS. 7A and 7B are schematic cross-sectional views illustrating an information recording and reproducing device according to the third specific example. As illustrated in FIGS. 7A and 7B, in the third specific example, the crystal nucleus particles 12B do not exist concentratedly near the interface with the electrode layer 11 or the electrode layer 13, but are dispersed in the recording layer 12. Also in this case, the crystal growth of the phase-change material 12A progresses easily from the crystal nucleus particle 12B. Therefore, the speed of operation such as the writing and erasing increases. Furthermore, the crystallization can be brought about by a small current. Therefore, also the information recording and reproducing device according to the third specific example enables high-speed operation and the reduction of power consumption.

Moreover, by the presence of the crystal nucleus particle 12B, the phase-change material 12A is crystallized surely when an operating voltage is applied. Therefore, the possibility that the writing or the like is incompletely performed is reduced. Furthermore, if a configuration is used in which the individual crystal nucleus particles 12B have an equal size and exist at regular intervals, the phase-change material 12A is crystallized relatively easily. Thus, also the information recording and reproducing device according to the third specific example can ensure stability in operation.

Next, the operation in the case where the individual crystal nucleus particles 12B have different sizes will now be described with reference to FIGS. 8A and 8B.

Here, the information recording and reproducing device according to the third specific example is dealt with as an example. As illustrated schematically in FIGS. 8A and 8B, in this information recording and reproducing device, the individual crystal nucleus particles 12B have different sizes.

The case will now be described where a voltage is applied to the phase-change material 12A in the amorphous state to change the phase-change material 12A into the crystal state. Here, in the case where the phase-change material 12A has a film thickness of, for example, about twice to five times the size of the crystal nucleus particle 12B, the ease with which a current can flow near the crystal nucleus particle 12B depends on the size of the particle. Since the crystal nucleus particle 12B is in the crystal state and has a lower resistivity than the phase-change material 12A, the larger the size of the crystal nucleus particle 12B is, the smaller the effective film thickness is in the region near the particle, and a current easily flows through this region. In contrast, the effective film thickness is large in a region in which the crystal nucleus particle 12B with a small size exists and a region in which the crystal nucleus particle 12B does not exist, and in these regions a current flows less easily than in a region in which there is the crystal nucleus particle 12B with a large size.

Figure 8A:
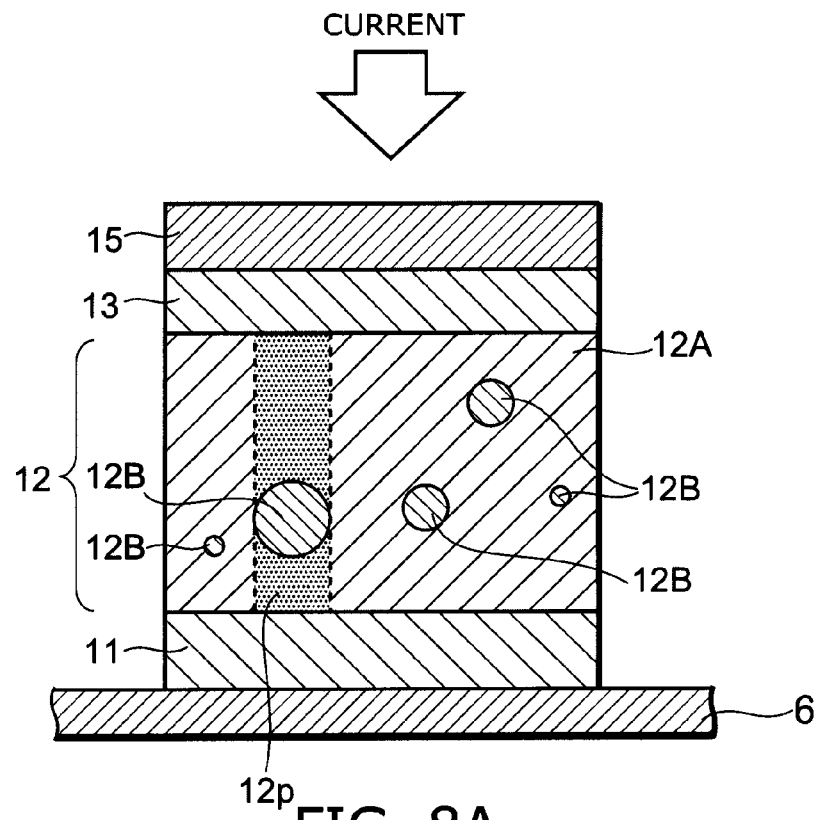
FIG. 8A and FIG. 8B are schematic cross-sectional views for illustrating the operation of the recording layer in the case where the individual crystal nucleus particles have different sizes.
Figure 8B:
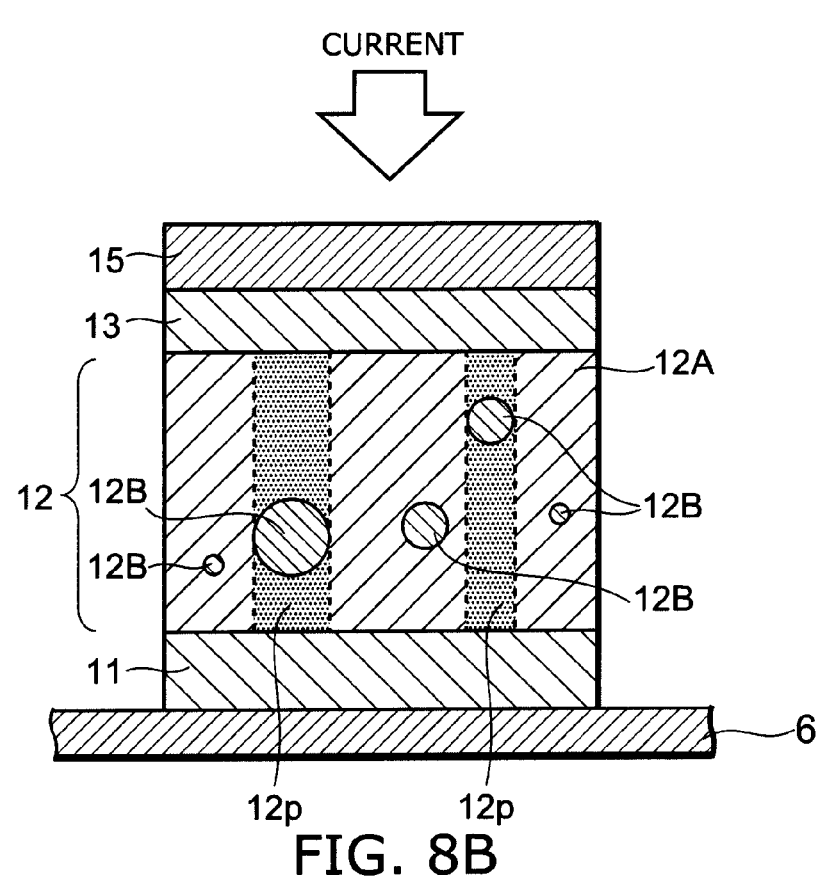

Therefore, when a current is passed through the recording layer 12, the current flows preferentially near a crystal nucleus particle 12B having a relatively large size (a current pathway 12$p$ in FIG. 8A). When a current is further passed, the current flows also near another crystal nucleus particle 12B having a relatively large size (current pathways 12$p$ in FIG. 8B). That is, by differentiating the sizes of the crystal nucleus particles 12B, a current flows selectively (partially) through the major surface of the recording layer 12.

Thereby, the region of the current pathway 12$p$ is heated to phase-change (become in the crystal state). Consequently, a low resistive pathway that connects the electrode layer 11 and the electrode layer 13 is formed in the recording layer 12, and the recording layer 12 becomes in the low resistance state. That is, the switching is completed. Furthermore, after the switching is completed, a current flows concentratedly through limited pathways (the current pathways 12$p$) during the reading and standby.

Thus, in the case where the individual crystal nucleus particles 12B have different sizes, power consumption can be significantly reduced during operation, standby (non-operation), and the like.

Furthermore, by the configuration in which the individual crystal nucleus particles 12B have different sizes, a multiple-value information recording and reproducing device can be obtained as described below.

In the case where a current is passed through the recording layer 12 as illustrated in FIG. 8A, the portion of one pathway 12$p$ becomes in the crystal state. On the other hand, in the case where a current is passed through the recording layer 12 as illustrated in FIG. 8B, the portions of two pathways 12$p$ become in the crystal state. Consequently, after switching, the resistance value is different between the recording layer 12 of FIG. 8A and the recording layer 12 of FIG. 8B. That is, the recording layer 12 can have three resistance values in total, including that in the initial state (amorphous state). If a current is further passed, also the portion of another pathway 12$p$ is crystallized, and consequently the recording layer 12 can have still another resistance value. Thus, the recording layer 12 can have a very large number of resistance values logically. By allotting different data "0", "1", "2", and the like to these different resistance values, a multiple-value information recording and reproducing device can be obtained.

Thus, by differentiating the sizes of the individual crystal nucleus particles 12B and appropriately adjusting the current passed through the recording layer 12 (applied voltage), a multiple-value information recording and reproducing device can be obtained.

Although here the information recording and reproducing device according to the third specific example is dealt with as an example, a multiple-value information recording and reproducing device can be similarly obtained also from the information recording and reproducing devices according to the first specific example and the second specific example.

Method for Manufacturing an Information Recording and Reproducing Device

Next, a method for manufacturing an information recording and reproducing device (cell portion) according to this embodiment will now be described with reference to FIG. 9A to FIG. 11C. Here, a method for manufacturing an information recording and reproducing device having a structure in which the information recording and reproducing device according to the second specific example (FIGS. 6A and 6B) is turned upside down is described.

FIG. 9A to FIG. 11C are schematic process cross-sectional views illustrating a method for manufacturing the information recording and reproducing device according to this embodiment.

Figure 9A:
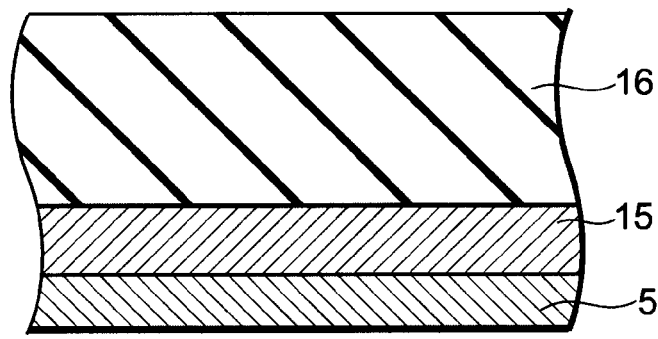
FIG. 9A to FIG. 11C are schematic process cross-sectional views illustrating a method for manufacturing the information recording and reproducing device according to the embodiment.

First, as illustrated in FIG. 9A, the second interconnection 15 is formed on a substrate 5, and an inter-element insulating layer 16 that separates cells from each other is formed on the second interconnection 15. $SiO_2$ or the like, for example, may be used as the material of the inter-element insulating layer 16.

Figure 9B:
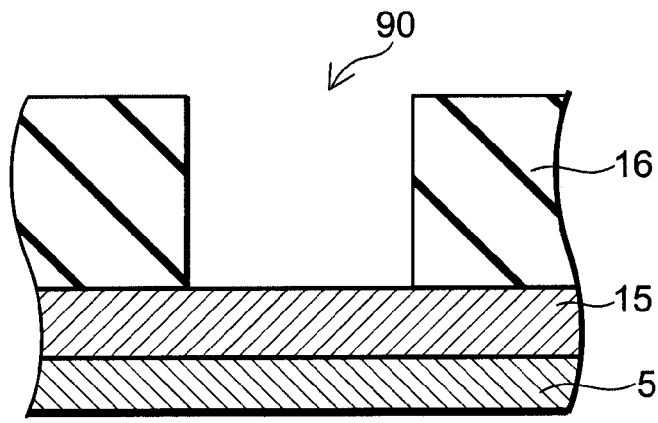

Next, as illustrated in FIG. 9B, etching processing is performed to the depth of the interface between the second interconnection 15 and the inter-element insulating layer 16 to form a region that defines a cell (cell formation region 90).

Figure 9C:
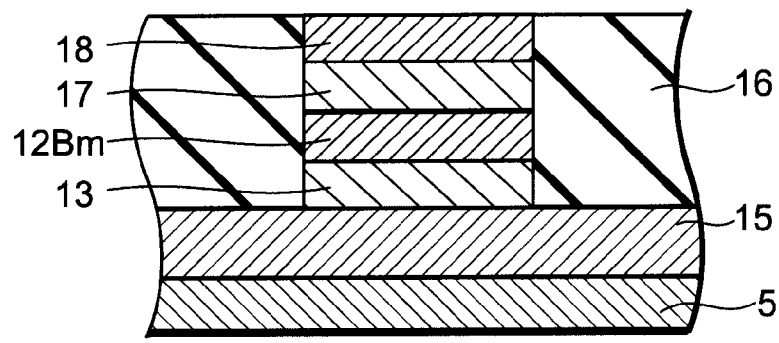

Next, as illustrated in FIG. 9C, the electrode layer 13 and a layer made of the material of the crystal nucleus 12B (crystal nucleus material layer 12Bm) are film-formed in this order from the lower side in the cell formation region 90. The sputtering method, for example, is given as the film-formation method. Then, nitriding treatment may be performed on the surface of the crystal nucleus material layer 12Bm.

Next, a mask member 17 is formed on the crystal nucleus material layer 12Bm. DLC (diamond-like carbon), for example, may be used as the material of the mask member 17. The ion beam deposition method, for example, is given as the formation method.

Then, a mask member 19 having a size of nanometer order along the major surface is formed above the mask member 17 in the following manner. The mask member 19 is formed in order to fabricate the crystal nucleus 12B formed of a crystal with a size of nanometer order (nanocrystal).

First, as illustrated in FIG. 9C, a layer (mask member 18) that forms the base of the mask member 19 is formed on the mask member 17. A diblock copolymer of PS (polystyrene) and P4VP (poly(4-vinylpyridine)), for example, may be used as the material of the mask member 18. The spin coat method using a solvent such as toluene, for example, is given as a method for forming the mask member 18.

Figure 10A:
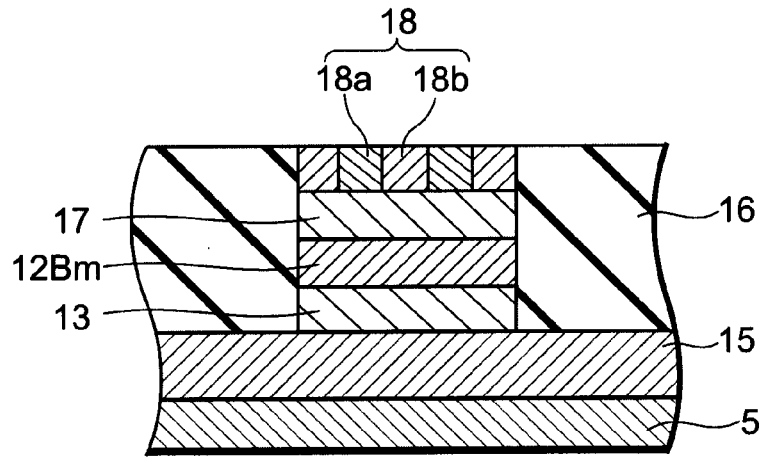

Next, as illustrated in FIG. 10A, this workpiece is heated to about 60° C., and the PS and P4VP are separated by self-assembly. Consequently, the mask member 18 is separated into a mask member 18$b$ of the PS and a mask member 18$a$ of the P4VP. The mask member 18$a$ and the mask member 18$b$ have a size of nanometer order along the major surface.

Figure 10B:
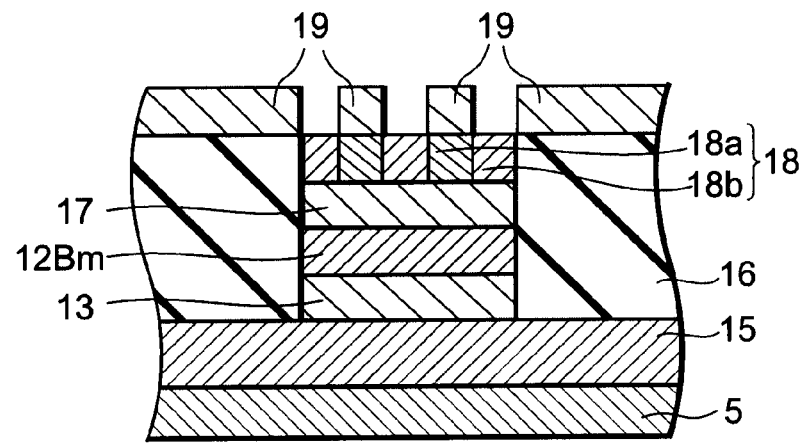

Next, the mask member 18 is exposed to a vapor of TEOS (tetraethoxysilane) and water, and is kept at about 65° C. Consequently, as illustrated in FIG. 10B, the crystal of $SiO_2$ is selectively formed on the region of the mask member 18a (P4VP region). The $SiO_2$ crystal layer forms the mask member 19 having a size of nanometer order along the major surface.

Figure 10C:
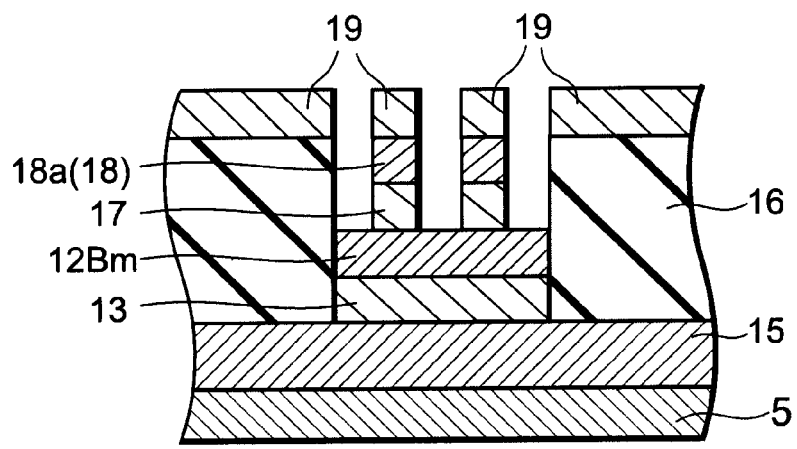

Next, as illustrated in FIG. 10C, the mask member 19 is used as a mask to perform RIE (reactive ion etching) using, for example, $CO_2$ or the like. Consequently, the region of the mask member 18b (PS region) is etched to the depth of the interface between the crystal nucleus material layer 12Bm and the mask member 17, and the crystal nucleus material layer 12B is exposed in this region.

Figure 11A:
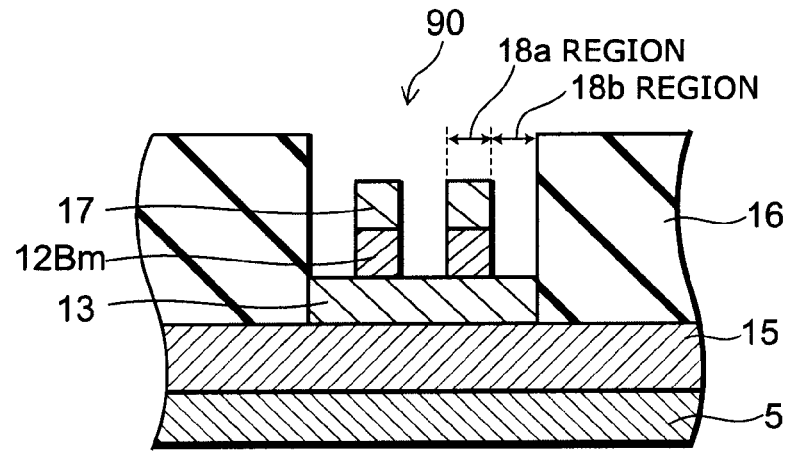

Next, as illustrated in FIG. 11A, ion milling is performed to remove the mask member 19 and the mask member 18a (at this time, the mask member 17 functions as a mask) in the mask member 18a region in the cell formation region 90 and remove the crystal nucleus material layer 12Bm in the mask member 18b region. Consequently, the crystal nucleus material layer 12Bm having a size of nanometer order along the major surface is formed in the mask member 18a region. Furthermore, the electrode layer 13 is exposed in the mask member 18b region.

Figure 11B:
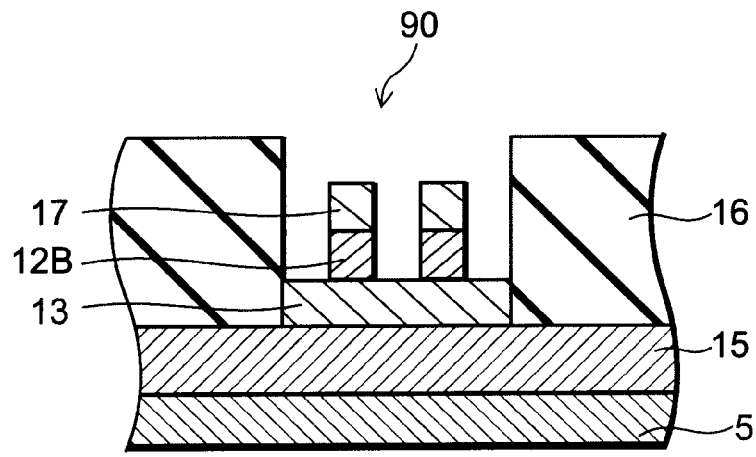

Then, as illustrated in FIG. 11B, the workpiece is heated to about 280° C. to crystallize the crystal nucleus material layer 12Bm. Consequently, the crystal nucleus 12B formed of a nanocrystal can be obtained. Before or after performing the crystallization, the crystal nucleus material layer 12Bm may be nitrided, or oxide of Hf, Ta, Cr, or the like may be film-formed by CVD (chemical vapor deposition) on the surface of the crystal nucleus material layer 12Bm; or a like process may be performed. Thereby, the crystal nucleus coating 12c that suppresses the diffusion of the crystal nucleus material 12n can be provided on the surface of the crystal nucleus 12B.

Figure 11C:
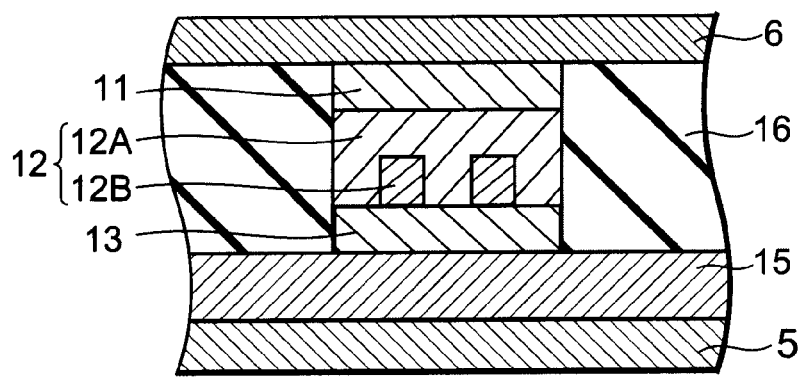

After that, as illustrated in FIG. 11C, the phase-change material 12A and the electrode layer 11 are formed in this order from the lower side in the cell formation region 90, and then planarization processing is performed. Then, the first interconnection 6 is formed on the workpiece.

Although not illustrated, the first interconnection 6 and the second interconnection 15 may be patterned so that they intersect with each other. Thereby, a cross-point information recording and reproducing device can be obtained. In this case, in the process described above in regard to FIG. 9B, the cell formation region 90 is formed in a first direction, the components up to the electrode layer 11 are formed by the method mentioned above (processes up to a part of the process described above in regard to FIG. 11C are performed), and then the following process is further performed. First, etching is performed in a second direction intersecting with the first direction to the depth of the interface between the substrate 5 and the second interconnection 15. Next, the inter-element insulating layer 16 is formed in the space caused by the etching by using, for example, CVD. Next, the first interconnection 6 is deposited uniformly on the workpiece. Next, etching is performed in the first direction to the depth of the interface between the electrode layer 11 and the first interconnection 6. At this time, the etching is performed so that the first interconnection 6 may pass above the cell formation region 90. After that, the inter-element insulating layer 16 is formed in the space caused by the etching by using, for example, CVD.

Thus, an information recording and reproducing device cell can be obtained having a structure in which the information recording and reproducing device according to the second specific example (FIGS. 6A and 6B) is turned upside down.

An application example of the information recording and reproducing device according to this embodiment will now be described.

Three cases will be described: the case where the recording unit according to this embodiment is used for a semiconductor memory; the case where it is used for a probe memory; and the case where it is used for a flash memory.

Semiconductor Memory

First, an information recording and reproducing device combined with a semiconductor device will now be described.

Figure 12:
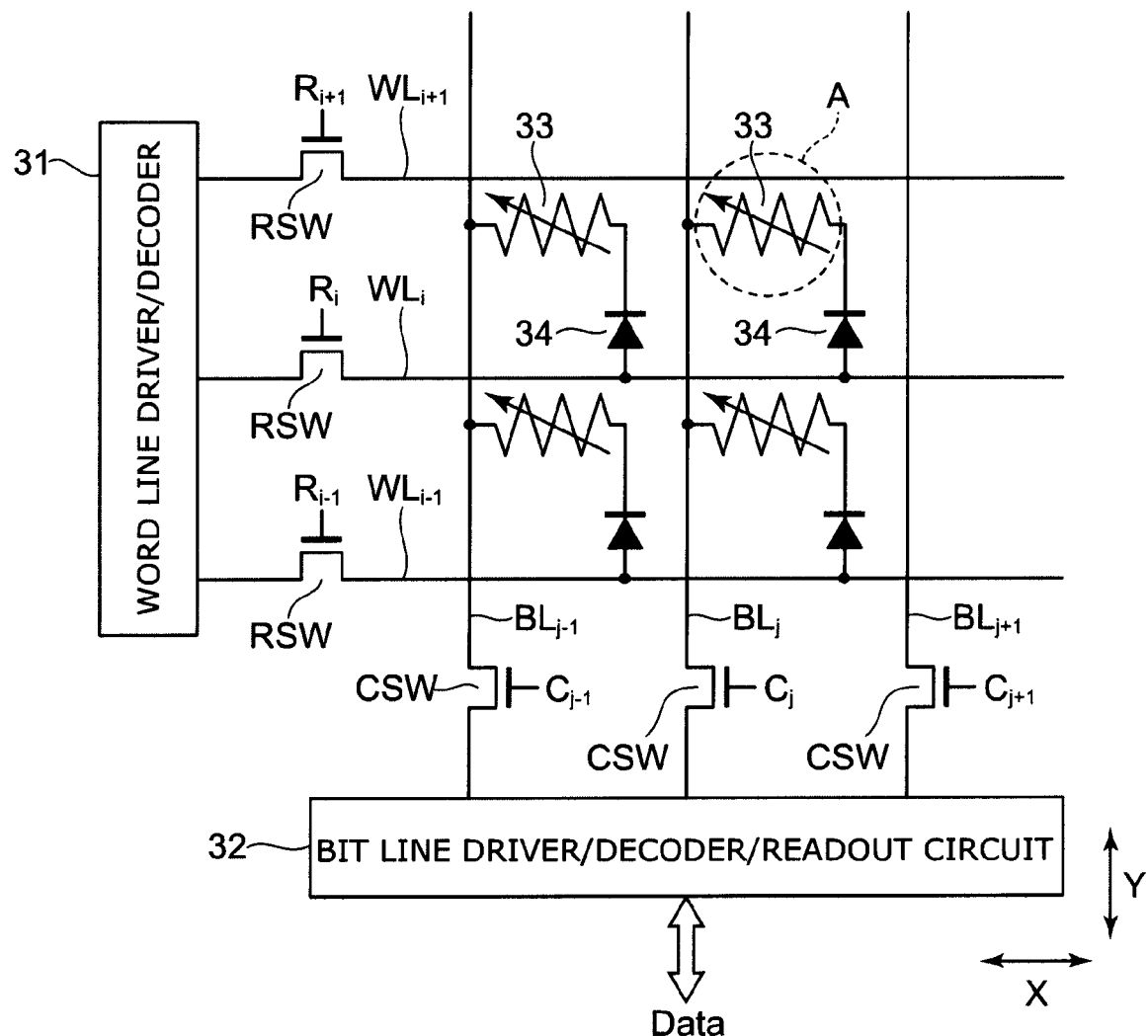
FIG. 12 is a schematic diagram illustrating a cross-point semiconductor memory according to the embodiment.

FIG. 12 is a schematic diagram illustrating a cross-point semiconductor memory according to this embodiment.

Word lines and $WL_{i-1}$, $WL_i$, and $WL_{i+1}$ extend in an X direction and bit lines $BL_{j-1}$, $BL_j$, , and $BL_{j+1}$ extend in a Y direction.

One ends of the word lines $WL_{i-1}$, $WL_i$, and $WL_{i+1}$ are connected to a word line driver/decoder 31 via MOS transistors RSW as selection switches, and one ends of the bit lines $BL_{j-1}$, $BL_j$, and $BL_{j+1}$ are connected to a bit line driver/decoder/readout circuit 32 via MOS transistors CSW as selection switches.

Selection signals $R_{i-1}$, $R_i$, and $R_{i+1}$ for selecting one word line (row) are inputted to the gates of the MOS transistors RSW, and selection signals $C_{j-1}$, $C_j$, and $C_{j+1}$ for selecting one bit line (column) are inputted to the gates of the MOS transistors CSW.

The memory cell 33 is disposed at the intersections of the word lines and $WL_{i+1}$, $WL_i$, and $WL_{i+1}$ and the bit lines $BL_{j-1}$, $BL_j$, and $BL_{j+1}$. This is what is called a cross-point cell array structure.

A diode 34 for suppressing a sneak current during the recording/reading is added to the memory cell 33.

Figure 13:
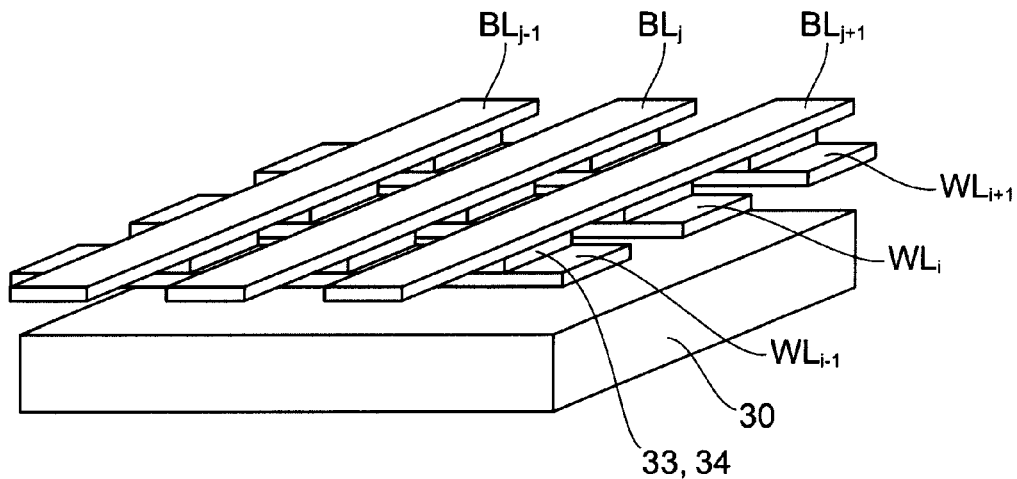
FIG. 13 to FIG. 15 are schematic views illustrating the structure of the memory cell array unit of the semiconductor memory illustrated in FIG. 12.

FIG. 13 is a schematic view illustrating the structure of the memory cell array unit of the semiconductor memory illustrated in FIG. 12.

The word lines $WL_{i-1}$, $WL_i$, and $WL_{i+1}$ and the bit lines $BL_{j-1}$, $BL_j$, and $BL_{j+1}$ are disposed on a semiconductor chip 30, and the memory cell 33 and the diode 34 are disposed at the intersections of these interconnections. A not-illustrated barrier layer may be provided between the diode 34 and the word line ($WL_i$ etc.).

Such a cross-point cell array structure is advantageous to high integration because it is not necessary to connect a MOS transistor individually to the memory cell 33. For example, as illustrated in FIG. 14 and FIG. 15, it is also possible to stack memory cells 33 to configure a three-dimensional memory cell array.

The memory cell 33 including the recording layer of this embodiment is formed of, for example, a stacked structure (the recording layer, electrode layer, protection layer, heater layer, and the like) like those illustrated in FIGS. 1A and 1B and FIG. 2. One memory cell 33 stores one bit data. The diode 34 is disposed between the word line $WL_i$ and the memory cell 33. As described above, a not-illustrated barrier layer may be provided between the diode 34 and the word line ($W_i$ etc.).

Figure 14:
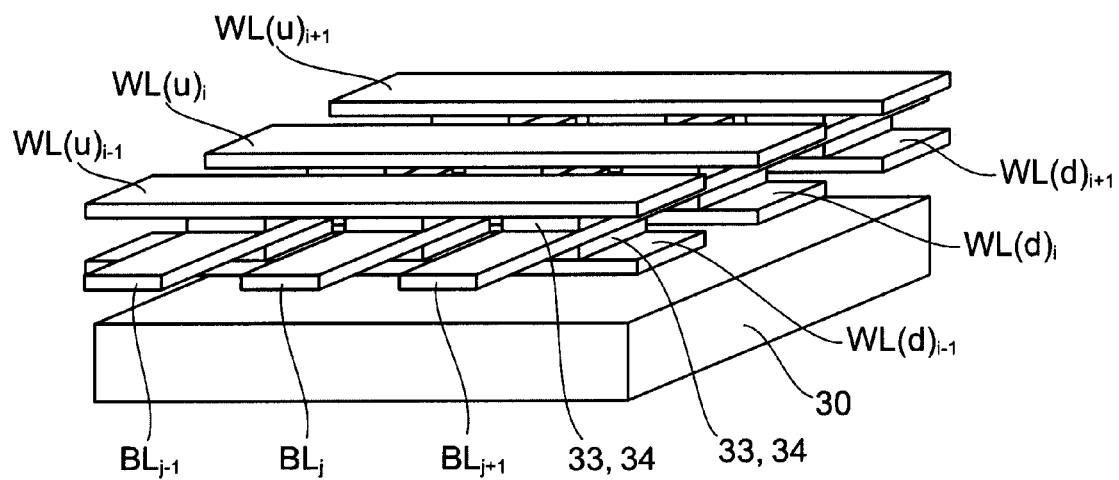
Figure 15:
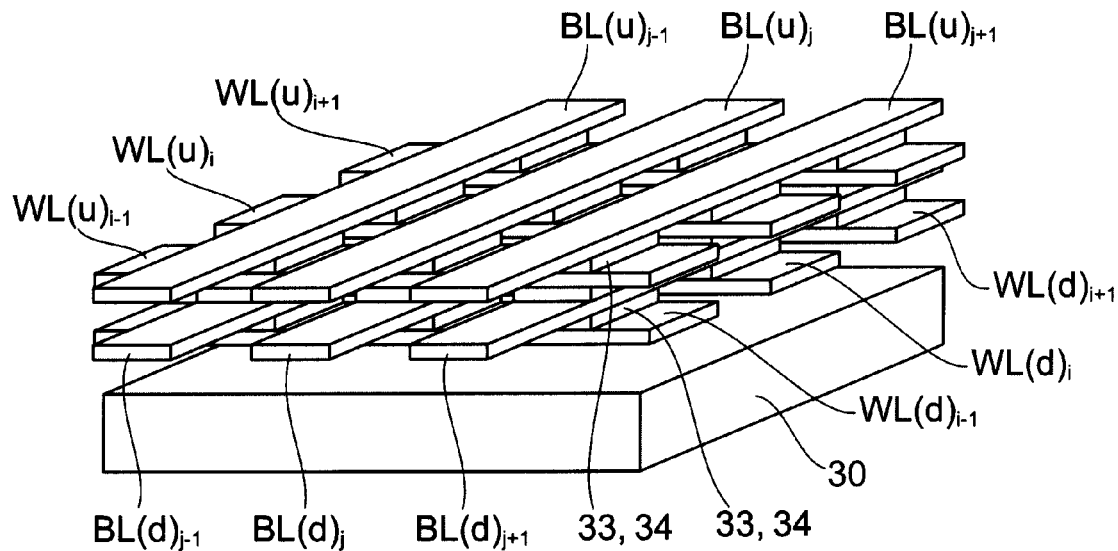

FIG. 14 and FIG. 15 are schematic views illustrating other specific examples of the memory cell array.

In the specific example illustrated in FIG. 14, the word lines and $WL_{i+1}$, $WL_i$, and $WL_{i+1}$ extending in the X direction are provided above and below the bit lines $BL_{j-1}$, $BL_j$, and $BL_{j+1}$ extending in the Y direction. The memory cell 33 and the diode 34 are disposed at each of the cross-points of these bit lines and word lines. In other words, this is a structure in which the bit line is shared between the memory cells thereabove and therebelow. A not-illustrated barrier layer may be provided between the diode 34 and the word line (WL(d)$_i$ etc.) and between the diode 34 and the bit line (BL$_j$ etc.).

The specific example illustrated in FIG. 15 has a structure in which the bit lines BL$_{j-1}$, BL$_j$, and BL$_{j+1}$ extending in the Y direction and the word lines WL$_{i-1}$, WL$_i$, and WL$_{i+1}$ extending in the X direction are alternately stacked. The memory cell 33 and the diode 34 are disposed at each of the cross-points of these bit lines and word lines. In other words, this is a structure in which the bit line and the word line are shared between the memory cells thereabove and therebelow. A not-illustrated barrier layer may be provided between the diode 34 and the word line (WL(d)$_i$ etc.), between the diode 34 and the bit line (BL(d)$_j$), and between the diode 34 and the word line (WL(u)$_i$ etc.).

Using a stacked structure like those illustrated in FIG. 14 and FIG. 15 allows increasing the recording density.

Next, the recording/reading operation of the semiconductor memory using the recording layer of this embodiment will now be described with reference to FIG. 12 and FIG. 13.

Here, the case will now be described where the memory cell 33 surrounded by a dotted line "A" in FIG. 12 is selected and the recording/reading operation is performed in this cell.

The recording (set operation, the crystallization of the recording layer) may be performed by applying a voltage to the selected memory cell 33 to pass a current pulse having a long pulse width through the memory cell 33. Therefore, a state is created in which, for example, the electric potential of the word line WL$_i$ is lower than the electric potential of the bit line BL$_j$. Assuming that the bit line BL$_j$ is set at a fixed potential (e.g. the ground potential), a negative potential may be applied to the word line WL$_i$. Consequently, the selected memory cell 33 surrounded by the dotted line "A" is provided with an electric conductivity due to the phase-change, and the recording (set operation) is thus completed. The set operation uses a current pulse having duration enough to crystallize the recording layer.

At the time of the recording, all the not-selected word lines and WL$_{i+1}$ and all the not-selected bit lines BL$_{j-1}$ and BL$_{j+1}$ are preferably biased to the same electric potential.

At the time of standby before the recording, all the word lines WL$_{i-1}$, WL$_i$, and WL$_{i+1}$ and all the bit lines BL$_{j-1}$, BL$_j$, and BL$_{j+1}$ are preferably precharged.

The current pulse for the recording may be generated by creating a state in which the electric potential of the word line WL$_i$ is higher than the electric potential of the bit line BL$_j$.

The reading is performed by passing a current pulse through the selected memory cell 33 surrounded by the dotted line "A" and detecting the resistance value of the memory cell 33. However, the current pulse has a minute value enough not to cause the phase change in the material of the memory cell 33.

For example, a readout current (current pulse) generated by the readout circuit is passed from the bit line BL$_j$ to the memory cell 33 surrounded by the dotted line "A", and the resistance value of the memory cell 33 is measured with the readout circuit.

The erasing (reset) operation is performed by Joule-heating the selected memory cell 33 surrounded by the dotted line "A" with a large current pulse to produce the phase change in the memory cell 33.

Thus, the cross-point nonvolatile memory device of this specific example is advantageous to high integration because it is not necessary to connect a MOS transistor individually to the memory unit of each cell and it is possible to stack multiple layers.

By using the recording layer 12 including the crystal nucleus 12B of this embodiment for the recording layer in the memory cell 33, the phase change is produced rapidly and the operating speed is increased; therefore, the recording can be performed with a shorter current pulse. Furthermore, power consumption is reduced, and stability in operation is ensured because the phase-change material 12A is crystallized surely. Furthermore, by appropriately adjusting the sizes of the crystal nucleus particles 12B, a multiple-value information recording and reproducing device can be provided.

Probe Memory

Next, the case where the information recording and reproducing device is used for a probe memory will now be described.

Figure 16:
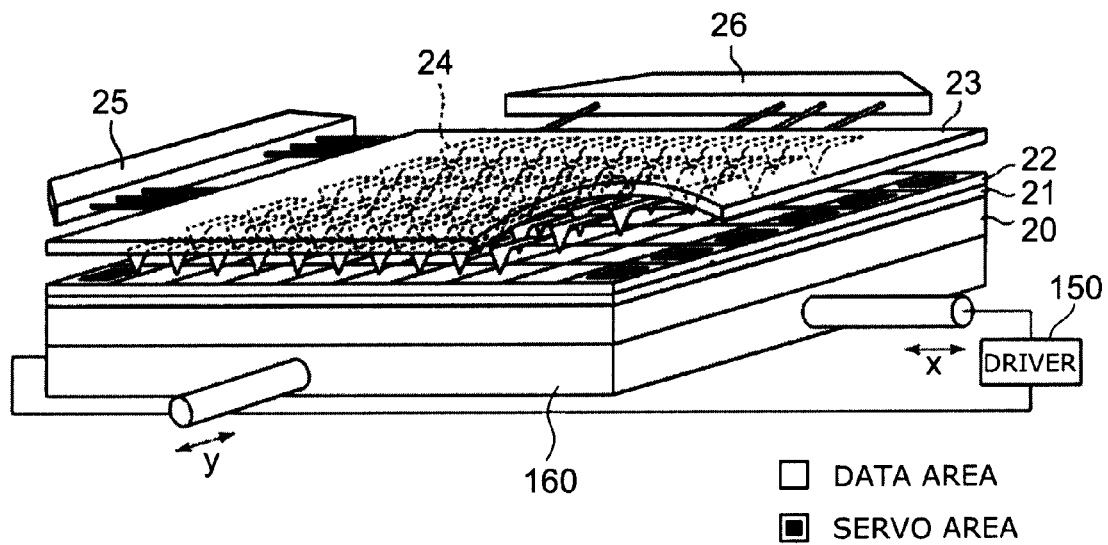
FIG. 16 is a perspective view schematically illustrating a probe memory according to the embodiment.
Figure 17:
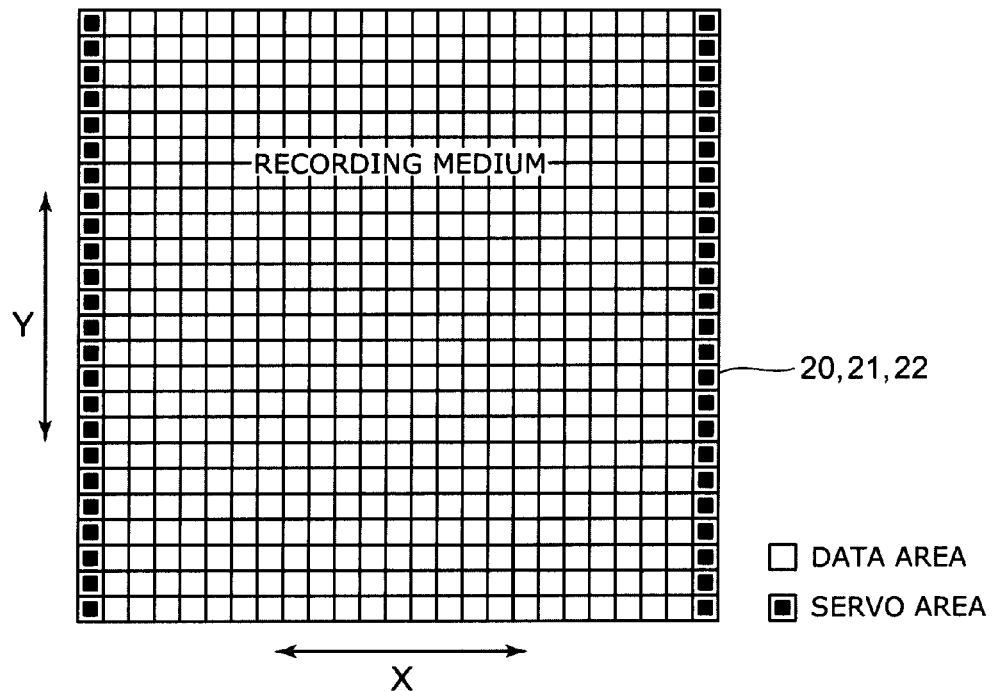
FIG. 17 is a plan view schematically illustrating a probe memory according to the embodiment.

FIG. 16 and FIG. 17 are schematic views illustrating a probe memory according to this embodiment.

A recording medium in which the recording unit of this embodiment is provided is disposed on an XY scanner 160. A probe array is disposed opposite to the recording medium.

The probe array includes: a substrate 23; and a plurality of probes (heads) 24 disposed in an array form on one side of the substrate 23. Each of the plurality of probes 24 is formed of, for example, a cantilever, and is driven by multiplex drivers 25 and 26.

The plurality of probes 24 can be operated individually by using a microactuator in the substrate 23. Here, an example is described in which all the probes 24 are collectively caused to perform the same operation to access the data areas of the recording medium.

First, all the probes 24 are reciprocated in the X direction with a constant period by using the multiplex drivers 25 and 26 to read out the positional information in the Y direction from servo areas of the recording medium. The positional information in the Y direction is transmitted to a driver 150.

The driver 150 drives the XY scanner 160 based on the positional information to move the recording medium in the Y direction to perform the positioning of the recording medium and the probes.

When the positioning of both is completed, the readout or writing of data is performed for all the probes 24 on/above the data areas simultaneously and continuously.

Since the probes 24 reciprocate in the X direction, the readout and writing of data are continuously performed. The readout and writing of data are performed one line at a time for the data areas by successively changing the position in the Y direction of the recording medium.

It is also possible to reciprocate the recording medium in the X direction with a constant period to read out the positional information from the recording medium and to move the probes 24 in the Y direction.

The recording medium is formed of, for example, a substrate 20, an electrode layer 21 on the substrate 20, and a recording layer 22 on the electrode layer 21.

The recording layer 22 includes: the plurality of data areas; and the servo areas disposed on both sides in the X direction of the plurality of data areas. The plurality of data areas occupy the main part of the recording layer 22.

A servo burst signal is recorded in the servo area. The servo burst signal indicates the positional information in the Y direction in the data areas.

In addition to the areas for the above information, an address area in which address data are recorded and a preamble area for synchronizing are disposed in the recording layer 22.

The data and the servo burst signal are recorded in the recording layer 22 as a recording bit (electric resistance variation). The "1" and "0" data of the recording bit are read out by detecting the electric resistance of the recording layer 22.

In this example, one probe (head) is provided for one data area, and one probe is provided for one servo area.

The data area is formed of a plurality of tracks. The track of the data area is identified through an address signal read out from the address area. The servo burst signal read out from the servo area is a signal for moving the probe 24 to the center of the track to eliminate reading errors of the recording bit.

Here, the head position control technology of HDD can be utilized by relating the X direction to the down track direction and the Y direction to the track direction.

Next, the record/read operation of the probe memory will now be described.

Figure 18:
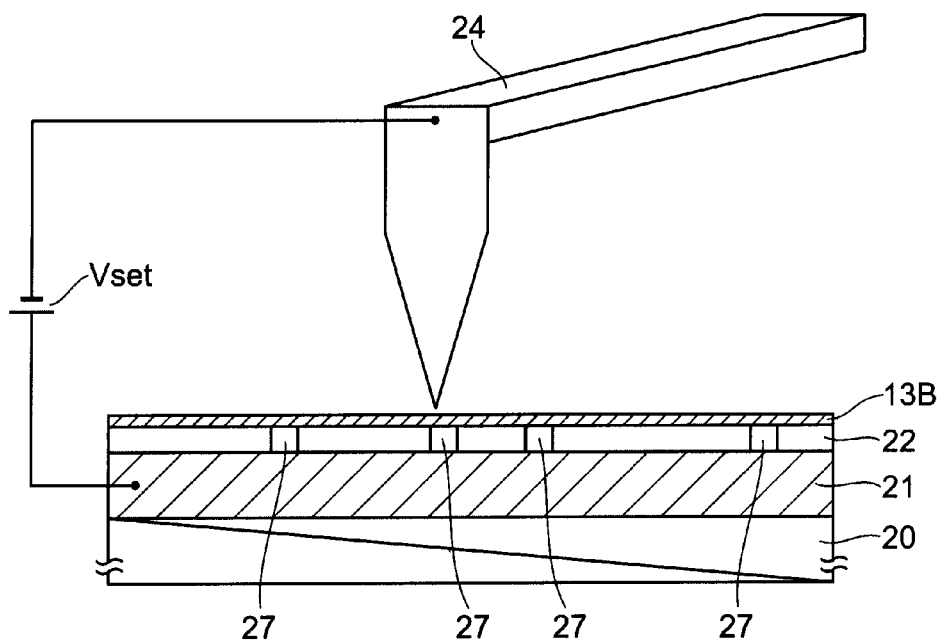
FIG. 18 is a conceptual view for describing the state at the time of the recording (set operation) of the probe memory according to the embodiment.

FIG. 18 is a conceptual view for describing the state at the time of the recording (set operation).

The recording medium includes: the electrode layer 21 on the substrate (e.g. a semiconductor chip) 20; the recording layer 22 on the electrode layer 21; and a protection layer 13B on the recording layer 22. A thin insulator, for example, is used for the protection layer 13B.

The set operation is performed by applying a voltage to the surface of a recording bit 27 of the recording layer 22 to generate an electric potential gradient in the recording bit 27. Specifically, a current/voltage pulse having a long pulse width may be applied to the recording bit 27. To this end, a state is created in which the electric potential of the probe 24 is lower than the electric potential of the electrode layer 21, or a state is created in which the electric potential of the probe 24 is higher than the electric potential of the electrode layer 21. Assuming that the electrode layer 21 is set at a fixed potential (e.g. the ground potential), a negative potential or a positive potential may be applied to the probe 24. In the set operation, a current pulse having duration enough to crystallize the recording layer is used.

The current pulse is generated by, for example, using an electron generation source or a hot electron source to emit electrons from the probe 24 toward the electrode layer 21. Alternatively, the probe 24 may be caused to be in contact with the surface of the recording bit 27 to apply a voltage pulse.

Consequently, since the recording bit 27 is provided with an electric conductivity due to the phase change, the resistance in the film thickness direction decreases and the recording (set operation) is completed.

The reading is performed by passing a current pulse through the recording bit 27 of the recording layer 22 and detecting the resistance value of the recording bit 27. However, the current pulse has a minute value enough not to cause the phase change in the material of the recording bit 27 of the recording layer 22.

For example, a readout current (current pulse) generated by a sense amplifier S/A is passed from the probe 24 to the recording bit 27, and the resistance value of the recording bit 27 is measured with the sense amplifier S/A. In regard to the reading, continuous reading becomes possible by scanning the recording medium with the probe 24.

The erase (reset) operation is performed by Joule-heating the recording bit 27 of the recording layer 22 with a large current pulse to produce the phase change in the recording bit 27.

The probe memory according to this embodiment can record information on recording units of the recording medium similarly to a hard disk.

By using the recording layer 12 including the crystal nucleus 12B of this embodiment for the recording layer 22, the phase change is produced rapidly and the operating speed is increased. Thereby, the recording can be performed with a shorter current pulse. Furthermore, power consumption is reduced, and stability in operation is ensured because the phase-change material 12A is crystallized surely. Furthermore, by appropriately adjusting the sizes of the crystal nucleus particles 12B, a multiple-value information recording and reproducing device can be provided.

Flash Memory

This embodiment can be also used for a flash memory.

Figure 19:
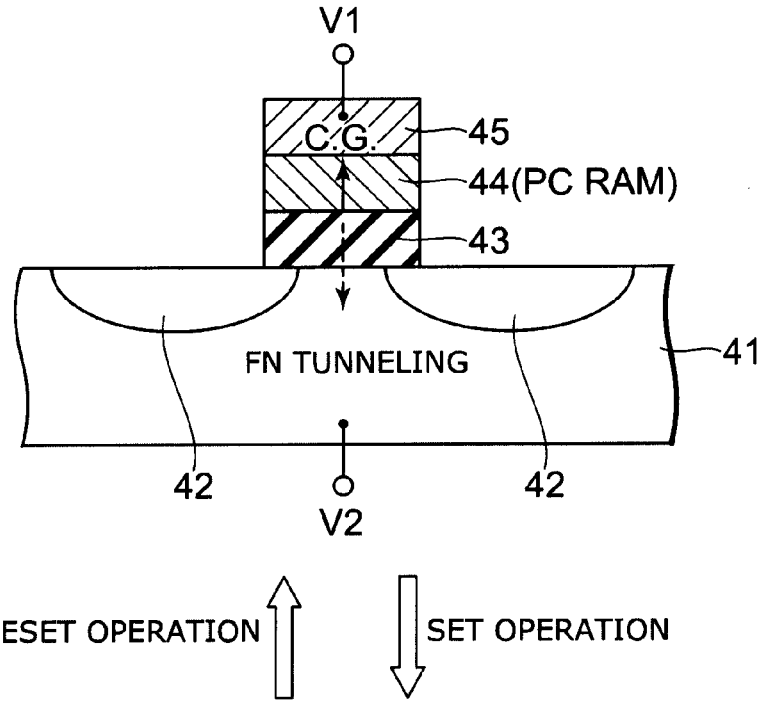
FIG. 19 is a schematic cross-sectional view illustrating a memory cell of a flash memory according to the embodiment.
Figure 19:
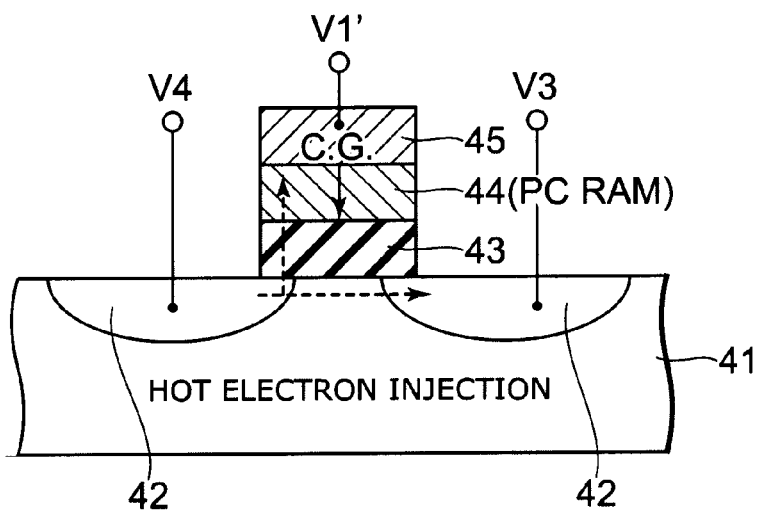

FIG. 19 is a schematic cross-sectional view illustrating a memory cell of a flash memory.

The memory cell of the flash memory includes a MIS (metal-insulator-semiconductor) transistor.

Diffusion layers 42 are formed in the surface region of a semiconductor substrate 41. A gate insulating layer 43 is formed on the channel region between the diffusion layers 42. A recording unit 44 (the recording layer (PCRAM) and the upper and lower electrode layers) of this embodiment is formed on the gate insulating layer 43. A control gate electrode 45 is formed on the recording unit 44.

The semiconductor substrate 41 may be a well region, and the semiconductor substrate 41 and the diffusion layer 42 have mutually opposite electric conductivity types. The control gate electrode 45 forms a word line, and a conductive polysilicon, for example, may be used therefor.

The operation of the device will now be described with reference to FIG. 19.

The set (writing) operation is performed by applying an electric potential V1 to the control gate electrode 45 and applying an electric potential V2 to the semiconductor substrate 41.

The difference between the electric potentials V1 and V2 is set to a magnitude enough to phase-change or resistance-change the recording unit 44. The direction thereof is not limited in particular.

That is, either V1>V2 or V1<V2 is possible.

For example, assuming that the recording unit 44 is an insulator (resistance being large) in the initial state (reset state), the gate insulating layer 43 is substantially thick, and therefore the threshold of the memory cell (MIS transistor) is high.

If the recording unit 44 is changed from this state to a conductor (resistance being small) by applying the electric potentials V1 and V2, the gate insulating layer 43 becomes substantially thin, and therefore the threshold of the memory cell (MIS transistor) becomes low.

Although the electric potential V2 was applied to the semiconductor substrate 41, instead the electric potential V2 may be transmitted from the diffusion layer 42 to the channel region of the memory cell.

The reset (erase) operation is performed by applying an electric potential V1' to the control gate electrode 45, applying an electric potential V3 to one of the diffusion layers 42, and applying an electric potential V4 (<V3) to the other of the diffusion layers 42.

The electric potential V1' is set to a value exceeding the threshold of the memory cell in the set state.

At this time, the memory cell becomes ON, electrons flow from the other of the diffusion layers 42 toward the one, and hot electrons are generated. Since the hot electrons are injected into the recording unit 44 via the gate insulating layer 43, the temperature of the recording unit 44 increases.

Thereby, the recording unit 44 changes from the conductor (resistance being small) to the insulator (resistance being large); therefore, the gate insulating layer 43 becomes substantially thick, and the threshold of the memory cell (MIS transistor) becomes high.

Thus, since the threshold of the memory cell can be changed by similar operation to flash memory, the information recording and reproducing device according to this embodiment can be put to practical use by utilizing the technology of flash memory.

NAND Flash Memory

Figure 20:
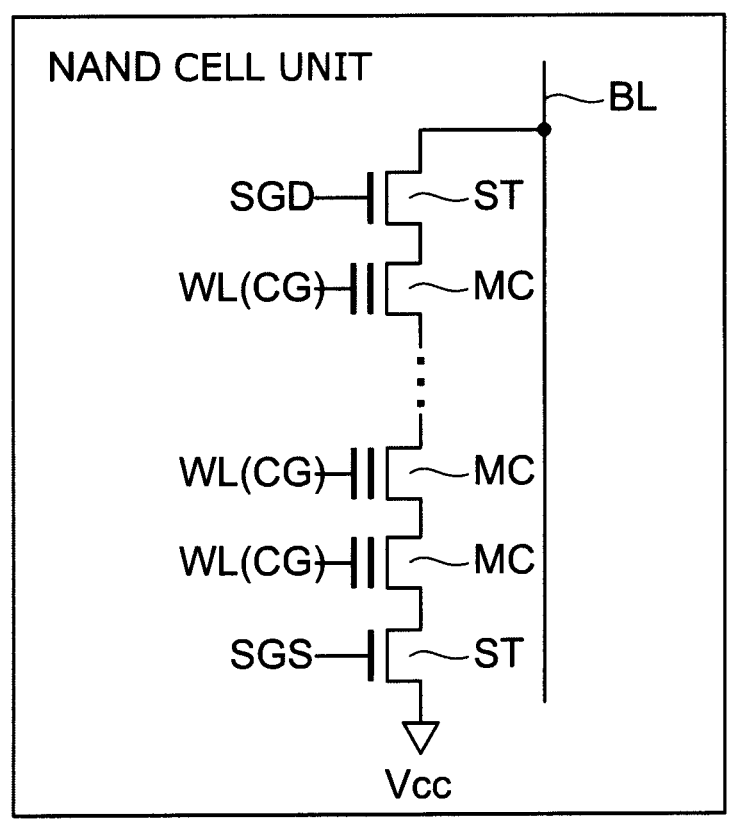
FIG. 20 is a circuit diagram of a NAND cell unit according to the embodiment.

FIG. 20 is a circuit diagram of a NAND cell unit.

Figure 21:
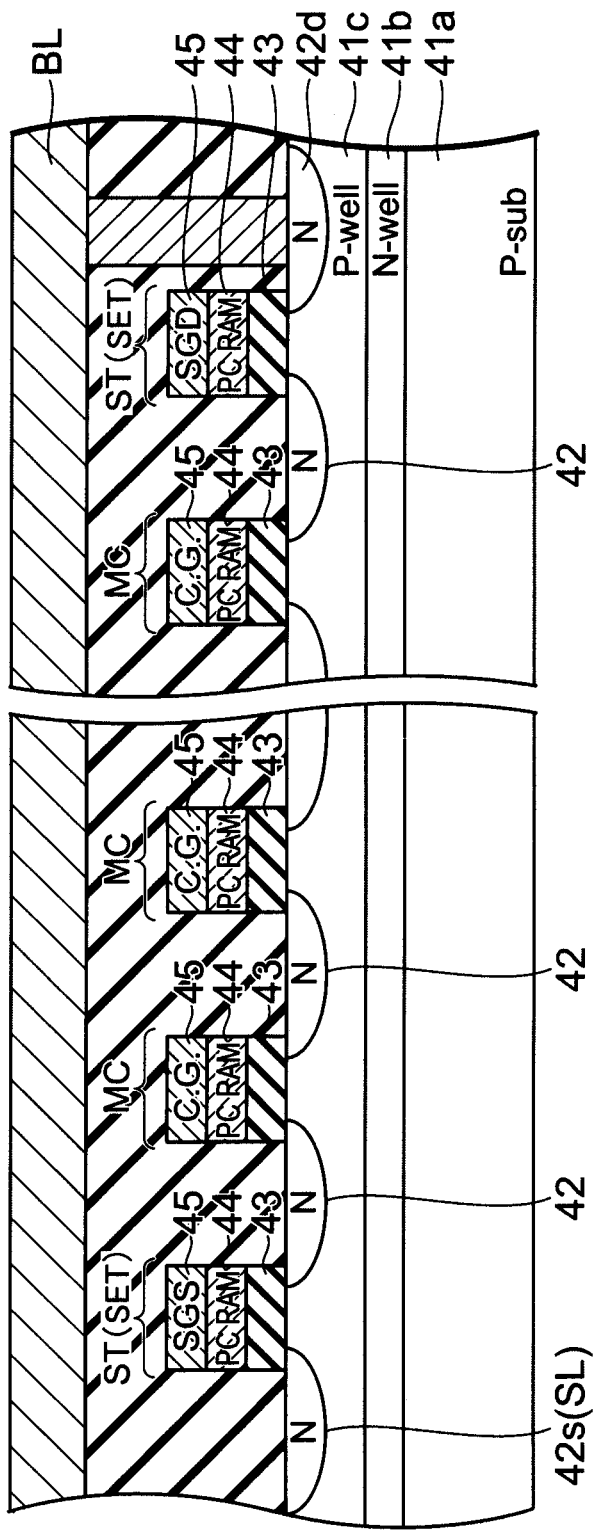
FIG. 21 to FIG. 23 are schematic views illustrating the structure of a NAND cell unit according to the embodiment.

FIG. 21 is a schematic view illustrating the configuration of a NAND cell unit according to this embodiment.

An N-type well region 41b and a P-type well region 41c are formed in a P-type semiconductor substrate 41a. The NAND cell unit according to an example of this embodiment is formed in the P-type well region 41c.

The NAND cell unit includes: a NAND string formed of a plurality of memory cells MC connected in series; and a total of two selection gate transistors ST connected to both ends of the NAND string one by one.

The memory cell MC and the selection gate transistor ST have the same structure. Specifically, these each include: the N-type diffusion layers 42; the gate insulating layer 43 on the channel region between the N-type diffusion layers 42; the recording unit 44 (the recording layer (PCRAM) and the upper and lower electrode layers) on the gate insulating layer 43; and the control gate electrode 45 on the recording unit 44.

The state (insulator/conductor) of the recording unit 44 of the memory cell MC can be changed by the operation described above. In contrast, the recording unit 44 of the selection gate transistor ST is kept in the set state, that is, a conductor (resistance being small).

One of the selection gate transistors ST is connected to a source line SL, and the other is connected to a bit line BL.

It is assumed that, before the set (write) operation, all the memory cells in the NAND cell unit are in the reset state (resistance being large).

The set (write) operation is performed successively from the memory cell MC on the source line SL side toward the memory cell on the bit line BL side one by one. V1 (a plus electric potential) is applied to the selected word line (control gate electrode) WL as writing potential, and Vpass is applied to the not-selected word lines WL as a transmission potential (an electric potential at which the memory cell MC becomes ON).

The selection gate transistor ST on the source line SL side is switched to OFF, the selection gate transistor ST on the bit line BL side is switched to ON, and program data is transmitted from the bit line BL to the channel region of the selected memory cell MC.

For example, when the program data is "1", a write inhibit potential (for example, an electric potential of approximately V1) is transmitted to the channel region of the selected memory cell MC so that the resistance value of the recording unit 44 of the selected memory cell MC may not change from a high level to a low level.

Furthermore, when the program data is "0", V2 (<V1) is transmitted to the channel region of the selected memory cell MC to change the resistance value of the recording unit 44 of the selected memory cell MC from a high level to a low level.

In the reset (erase) operation, for example, V1' is applied to all the word lines (control gate electrodes) WL to switch all the memory cells MC in the NAND cell unit to ON. Furthermore, the two selection gate transistors ST are switched to ON, V3 is applied to the bit line BL, and V4 (<V3) is applied to the source line SL.

At this time, since hot electrons are injected to the recording units 44 of all the memory cells MC in the NAND cell unit, the reset operation is performed collectively for all the memory cells MC in the NAND cell unit.

The readout operation is performed by applying a readout potential (plus potential) to the selected word line (control gate electrode) WL and applying an electric potential at which all the memory cells MC become ON irrespective of the data "0" or "1" to the not-selected word lines (control gate electrodes) WL.

Furthermore, the two selection gate transistors ST are switched to ON, and a readout current is supplied to the NAND string.

Since the selected memory cell MC becomes ON or OFF in accordance with the value of the data stored therein when the readout potential is applied, the data can be read out by, for example, detecting the change of the readout current.

Figure 22:
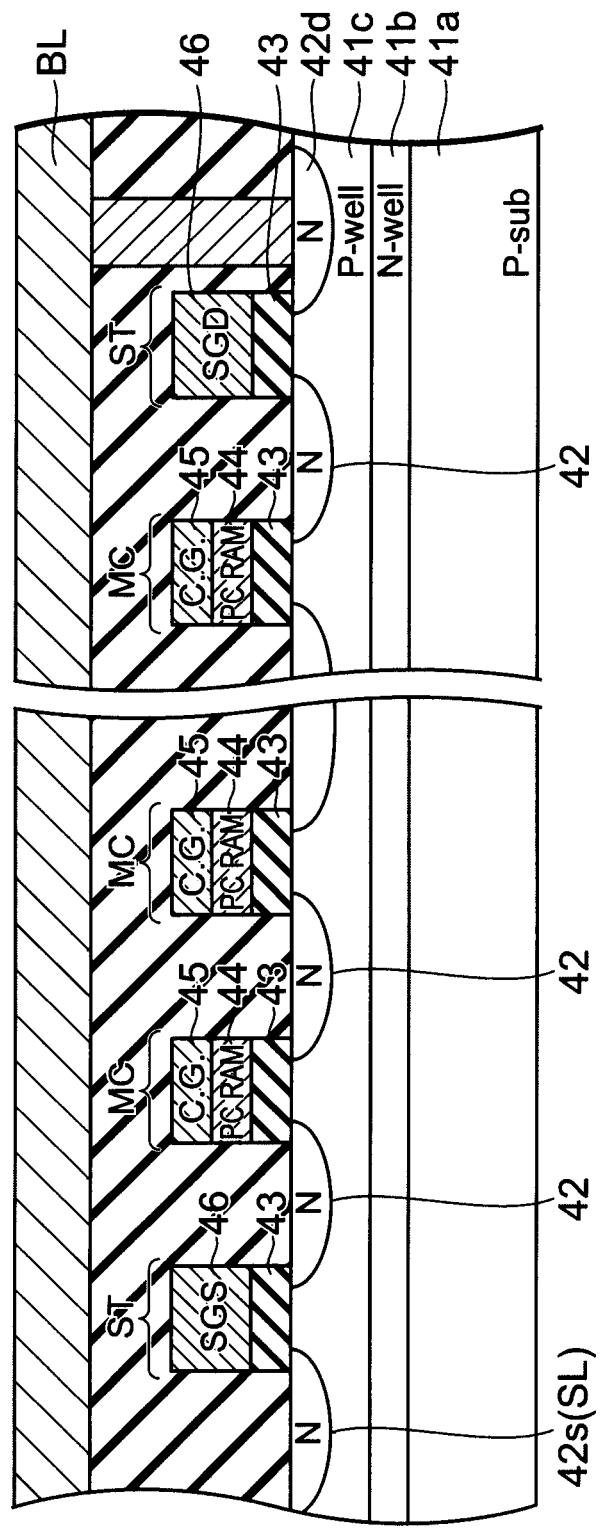

Although the selection gate transistor ST has the same structure as the memory cell MC in the structure illustrated in FIG. 21, the selection gate transistor ST may be a common MIS transistor without forming the recording unit as illustrated in, for example, FIG. 22.

Figure 23:
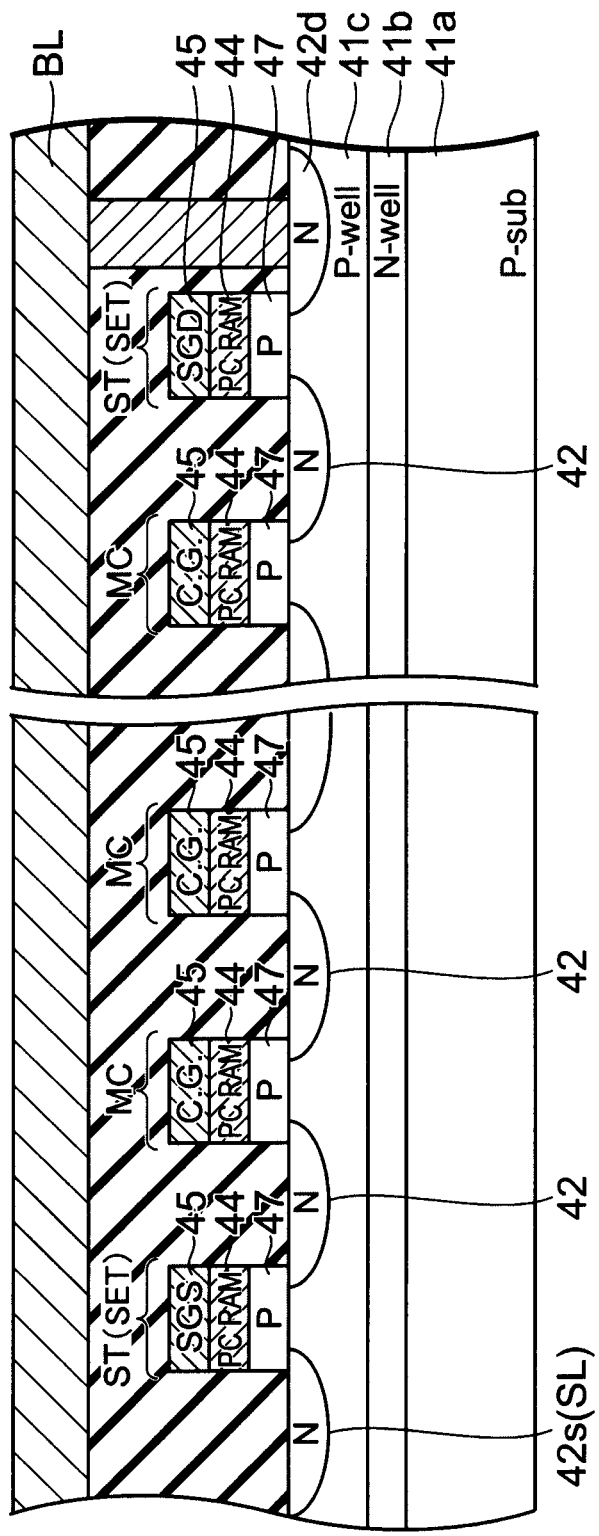

FIG. 23 is a schematic view illustrating an alteration example of the NAND flash memory.

This alteration example has a structure in which the gate insulating layers of the plurality of memory cells MC included in the NAND string are replaced with P-type semiconductor layers 47.

If high integration progresses and the memory cell MC is downsized, the P-type semiconductor layer 47 is filled with a depletion layer in a state in which no voltage is applied.

At the time of the set (writing), a plus writing potential (e.g. 3.5 V) is applied to the control gate electrode 45 of the selected memory cell MC, and a plus transmission potential (e.g. V) is applied to the control gate electrodes 45 of the not-selected memory cells MC.

At this time, the surfaces of the P-type well regions 41c of the plurality of memory cells MC in the NAND string are reversed from the P type to the N type and channels are formed.

Accordingly, as described above, the set operation can be performed by switching the selection gate transistor ST on the bit line BL side to ON and transmitting the program data "0" from the bit line BL to the channel region of the selected memory cell MC.

The reset (erasing) can be performed collectively for all the memory cells MC included in the NAND string by, for example, applying a minus erasing potential (e.g. −3.5 V) to all the control gate electrodes 45 and applying the ground potential (0 V) to the P-type well region 41c and the P-type semiconductor layer 47.

At the time of the readout, a plus readout potential (e.g. 0.5 V) is applied to the control gate electrode 45 of the selected memory cell MC, and a transmission potential (e.g. 1 V) at which the memory cell MC becomes ON irrespective of the data "0" or "1" is applied to the control gate electrodes 45 of the not-selected memory cells MC.

However, the threshold voltage Vth"1" of the memory cell MC in the "1" state satisfies 0 V<Vth"1"<0.5 V, and the threshold voltage Vth"0" of the memory cell MC in the "0" state satisfies 0.5 V<Vth"0"<1 V.

Furthermore, the two selection gate transistors ST are switched to ON, and a readout current is supplied to the NAND string.

In such a state, the amount of the current flowing through the NAND string changes in accordance with the value of the data stored in the selected memory cell MC, and the data can be thus read out by detecting the change.

In this alteration example, the hole doping amount of the P-type semiconductor layer 47 is preferably larger than that of the P-type well region 41c, and the Fermi level of the P-type semiconductor layer 47 is preferably deeper than that of the P-type well region 41c by about 0.5 V.

This is in order that, when a plus potential is applied to the control gate electrode 45, the inversion from the P type to the N type may start from the surface portion of the P-type well region 41c between the N-type diffusion layers 42 to form a channel.

In this way, for example, the channels of the not-selected memory cells MC are formed only at the interface between the P-type well region 41c and the P-type semiconductor layer 47 during the writing, and the channels of the plurality of memory cells MC in the NAND string are formed only at the interface between the P-type well region 41c and the P-type semiconductor layer 47 during the readout.

In other words, even if the recording unit 44 of the memory cell MC is a conductor (in the set state), the diffusion layer 42 and the control gate electrode 45 do not short-circuit.

NOR Flash Memory

Figure 24:
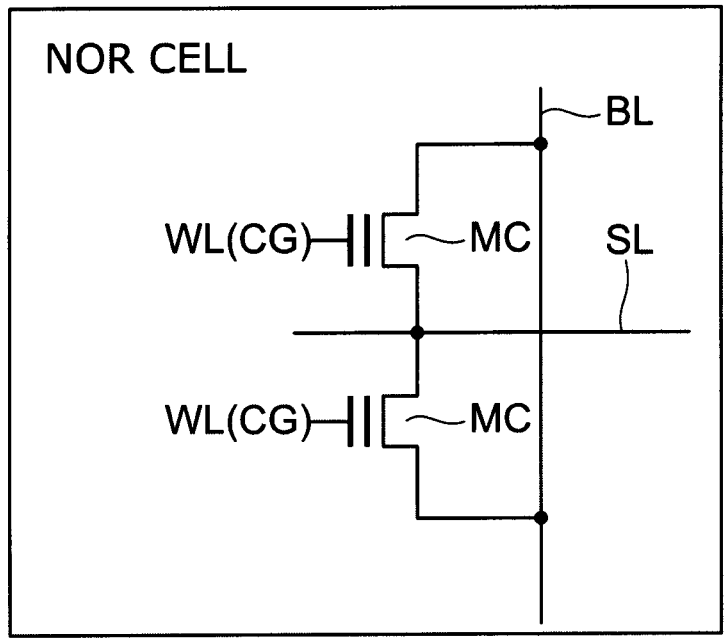
FIG. 24 is a circuit diagram of a NOR cell unit according to the embodiment.

FIG. 24 is a circuit diagram of a NOR cell unit.

Figure 25:
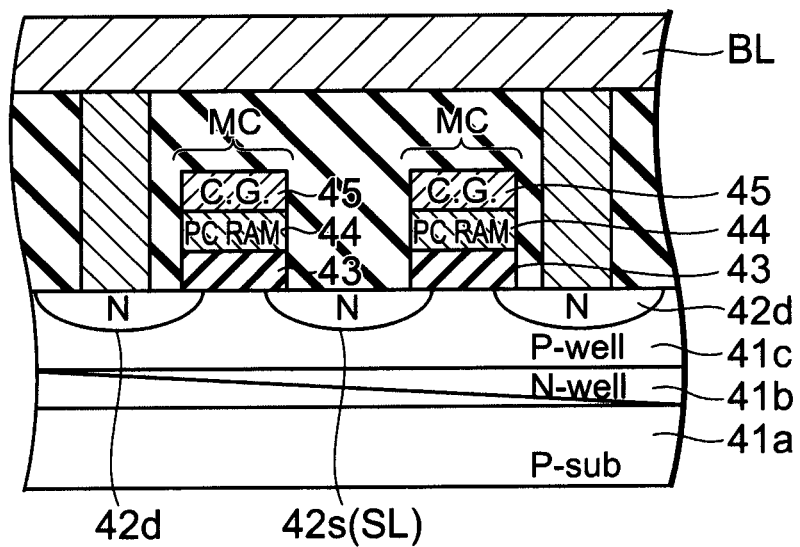
FIG. 25 is a schematic view illustrating the structure of the NOR cell unit according to the embodiment.

FIG. 25 is a schematic view illustrating the structure of a NOR cell unit according to an example of this embodiment.

The N-type well region 41b and the P-type well region 41c are formed in the P-type semiconductor substrate 41a. A NOR cell according to an example of this embodiment is formed in the P-type well region 41c.

The NOR cell includes one memory cell (MIS transistor) MC connected to the bit line BL and the source line SL.

The memory cell MC is formed of: the N-type diffusion layers 42; the gate insulating layer 43 on the channel region between the N-type diffusion layers 42; the recording unit 44 (the recording layer (PCRAM) and the upper and lower electrode layers) on the gate insulating layer 43; and the control gate electrode 45 on the recording unit 44. The state (insulator/conductor) of the recording unit 44 of the memory cell MC can be changed by the operation described above.

Two-transistor Flash Memory

Figure 26:
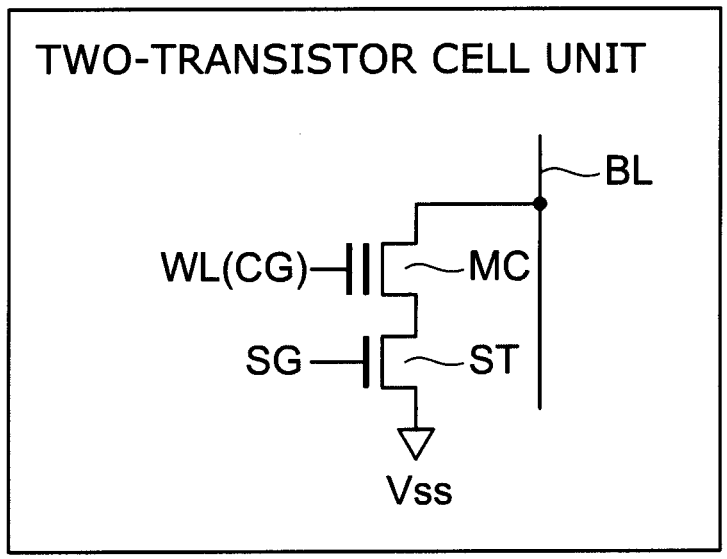
FIG. 26 is a circuit diagram of a two-transistor cell unit according to the embodiment.

FIG. 26 is a circuit diagram of a two-transistor cell unit.

Figure 27:
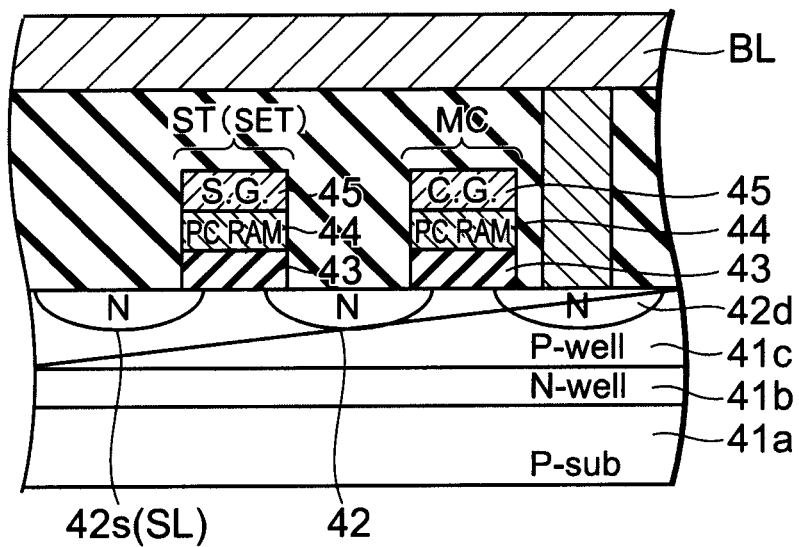
FIG. 27 and FIG. 28 are schematic views illustrating the structure of a two-transistor cell unit according to the embodiment.

FIG. 27 is a schematic view illustrating the structure of a two-transistor cell unit according to this embodiment.

The two-transistor cell unit has been recently developed as a new cell structure that has both the feature of the NAND cell unit and that of the NOR cell.

The N-type well region 41b and the P-type well region 41c are formed in the P-type semiconductor substrate 41a. the two-transistor cell unit according to an example of this embodiment is formed in the P-type well region 41c.

The two-transistor cell unit includes one memory cell MC and one selection gate transistor ST connected in series.

The memory cell MC and the selection gate transistor ST have the same structure. Specifically, these each include: the N-type diffusion layers 42; the gate insulating layer 43 on the channel region between the N-type diffusion layers 42; the recording unit 44 (the recording layer (PCRAM) and the upper and lower electrode layers) on the gate insulating layer 43; and the control gate electrode 45 on the recording unit 44.

The state (insulator/conductor) of the recording unit 44 of the memory cell MC can be changed by the operation described above. In contrast, the recording unit 44 of the selection gate transistor ST is kept in the set state, namely, a conductor (resistance being small).

The selection gate transistor ST is connected to the source line SL, and the memory cell MC is connected to the bit line BL.

Figure 28:
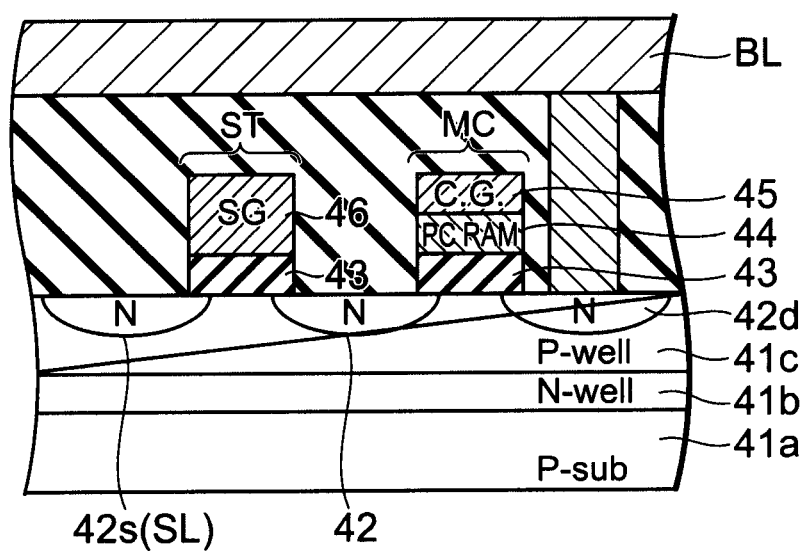

Although the selection gate transistor ST has the same structure as the memory cell MC in the structure illustrated in FIG. 27, the selection gate transistor ST may be a common MIS transistor without forming the recording unit as illustrated in FIG. 28, for example.

Other than the above, the material and operation presented by this embodiment may be used for a recording medium such as a current hard disk and DVD.

By using the recording layer 12 including the crystal nucleus 12B of this embodiment for the recording layer 44, the phase change is produced rapidly and the operating speed is increased. Thereby, power consumption is reduced, and the phase-change material 12A is crystallized surely to ensure stability in operation. Furthermore, by appropriately adjusting the sizes of the crystal nucleus particles 12B, a multiple-value information recording and reproducing device can be provided.

As described above, by using the recording layer 12 including the crystal nucleus 12B for the recording layer, the information recording and reproducing device according to this embodiment can increase the operating speed, reduce power consumption, and ensure stability in operation. Furthermore, by appropriately adjusting the sizes of the crystal nucleus particles 12B, a multiple-value information recording and reproducing device can be provided.

Examples of this embodiment are not limited to the embodiments described above, but may be embodied with alteration of the components without departing from the purport of this embodiment. The examples of this embodiment define the set and reset by taking the state immediately after the film-formation as the initial state. However, the definition of the set and reset is optional, and is not limited to the examples of this embodiment. Furthermore, various inventions can be designed by appropriately combining the plurality of components disclosed in the embodiments described above. For example, some of all the components disclosed in the embodiments described above may be removed, or components of different embodiments may be appropriately combined.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. An information recording and reproducing device comprising: a stacked body, the stacked body including:
   a first electrode layer;
   a second electrode layer; and
   a recording layer provided between the first electrode layer and the second electrode layer,
   the recording layer including:
      a phase-change material capable of reversely changing between a crystal state and an amorphous state by an electric current supplied via the first electrode layer and the second electrode layer; and
      a plurality of crystal nuclei provided in contact with the phase-change material and aligned in direct contact with at least one of the first electrode layer and the second electrode layer, each of the crystal nuclei including:
         a crystal nucleus material having a crystal structure identical to a crystal structure of the crystal state of the phase-change material; and a crystal nucleus coating provided on a surface of the crystal nucleus material and having a composition different from a composition of the crystal nucleus material.

2. The device according to claim 1, wherein
the crystal nucleus is in a crystal state when the phase-change material is in the crystal state and
the crystal nucleus is in a crystal state when the phase-change material is in the amorphous state.

3. The device according to claim 1, wherein the crystal nucleus has a melting point higher than a melting point of the phase-change material.

4. The device according to claim 1, wherein the crystal nucleus coating contains nitride of the crystal nucleus material.

5. The device according to claim 1, wherein the crystal nucleus material contains germanium.

6. The device according to claim 1, wherein the crystal nucleus coating contains germanium nitride.

7. The device according to claim 1, wherein the crystal nucleus coating contains oxide of at least one of Hf, Ta, and Cr.

8. The device according to claim 1, further comprising:
a low electrically conductive film having an electrical conductivity lower than an electric conductivity of the crystal nucleus,
a plurality of the crystal nuclei are provided, and
the low electrically conductive film is disposed between the plurality of crystal nuclei and at least one of the first electrode layer and the second electrode layer.

9. The device according to claim 1, wherein the crystal nucleus is in a particle form.

10. The device according to claim 9, wherein the crystal nucleus in a particle form has an average particle size of 10 nanometers or less.

11. The device according to claim 9, wherein a plurality of the crystal nuclei are provided and the plurality of crystal nuclei have a uniform particle size.

12. The device according to claim 9, wherein a plurality of the crystal nuclei are provided and one of the plurality of crystal nuclei has a particle size different from a particle size of another of the plurality of crystal nuclei.

13. The device according to claim 1, further comprising:
an interconnection electrically connected to one of the first electrode layer and the second electrode layer; and
a rectifying element provided between the one of the first electrode layer and the second electrode layer and the interconnection.

14. The device according to claim 1, further comprising:
an interconnection electrically connected to one of the first electrode layer and the second electrode layer; and
a heater layer provided between the one of the first electrode layer and the second electrode layer and the interconnection.

15. The device according to claim 1, wherein at least one of the first electrode layer and the second electrode layer contains nitride of at least one element selected from the group consisting of Ti, Zr, Hf, V, Nb, and Ta.

16. The device according to claim 1, wherein the phase-change material includes a chalcogenide-based material containing at least one of Se and Te.

17. The device according to claim 1, wherein the crystal nucleus includes a material having a lattice constant identical to a lattice constant of the phase-change material.

18. The device according to claim 1, further comprising:
a first interconnection extending in a first direction; and
a second interconnection extending in a second direction intersecting the first direction,
the stacked body being provided between the first interconnection and the second interconnection at an intersection of the first interconnection and the second interconnection, and the current being supplied via the first and second interconnections.

19. The device according to claim 1, wherein the stacked body is provided in plural and the plurality of stacked bodies are stacked along a direction toward the second electrode layer from the first electrode layer.

* * * * *